(12) United States Patent
Kim et al.

(10) Patent No.: US 12,124,659 B2
(45) Date of Patent: Oct. 22, 2024

(54) DISPLAY DEVICE

(71) Applicant: Samsung Display Co., Ltd., Yongin-Si (KR)

(72) Inventors: Yongmyeong Kim, Yongin-si (KR);
Byeonggi Kim, Yongin-si (KR);
Hyuk-Jin Kim, Yongin-si (KR);
Sungsang Park, Yongin-si (KR);
Hyunchul Son, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/138,172

(22) Filed: Apr. 24, 2023

(65) Prior Publication Data

US 2023/0393696 A1    Dec. 7, 2023

(30) Foreign Application Priority Data

Jun. 2, 2022  (KR) .................. 10-2022-0067399

(51) Int. Cl.
| | | |
|---|---|---|
| *H05K 1/02* | (2006.01) | |
| *G06F 1/16* | (2006.01) | |
| *G06F 3/041* | (2006.01) | |
| *G06F 3/044* | (2006.01) | |
| *H10K 59/131* | (2023.01) | |
| *H10K 59/80* | (2023.01) | |

(52) U.S. Cl.
CPC .......... *G06F 3/0445* (2019.05); *G06F 3/0412* (2013.01); *G06F 3/04164* (2019.05); *H10K 59/131* (2023.02); *H10K 59/8791* (2023.02); *G06F 3/0446* (2019.05); *G06F 2203/04111* (2013.01)

(58) Field of Classification Search
CPC .................................................. H10K 59/131
See application file for complete search history.

(56) References Cited

U.S. PATENT DOCUMENTS

| 8,633,915 B2 | 1/2014 | Hotelling et al. |
| 9,397,659 B2 | 7/2016 | Lee et al. |
| (Continued) | | |

FOREIGN PATENT DOCUMENTS

| KR | 10-1597483 B1 | 2/2016 |
| KR | 10-2009321 B1 | 8/2019 |
| (Continued) | | |

*Primary Examiner* — Nan-Ying Yang
(74) *Attorney, Agent, or Firm* — Innovation Counsel LLP

(57) ABSTRACT

A display device includes a display panel including a first non-bending area, a bending area, and a second non-bending area, which are sequentially arranged in a first direction, and an input sensor including sensing electrodes and first and second trace lines. The first trace line includes a first line portion, a second line portion, and a first bridge connecting the first and second line portions and disposed on a layer different from the first and second line portions. The second trace line includes a third line portion, a fourth line portion disposed on a layer different from the third line portion, and a second bridge connecting the third and fourth line portions and disposed on a layer different from the third and fourth line portions. The first bridge and the second bridge do not overlap each other in a second direction perpendicular to the first direction.

20 Claims, 11 Drawing Sheets

(56) References Cited

U.S. PATENT DOCUMENTS

2015/0382446 A1* 12/2015 Kwon .................. G06F 1/1643
   174/251
2017/0337873 A1* 11/2017 Kim .................... G09G 3/3233
2022/0100303 A1   3/2022 Lee et al.

FOREIGN PATENT DOCUMENTS

KR   10-2020-0092535 A   8/2020
KR   10-2021-0079787 A   6/2021

* cited by examiner

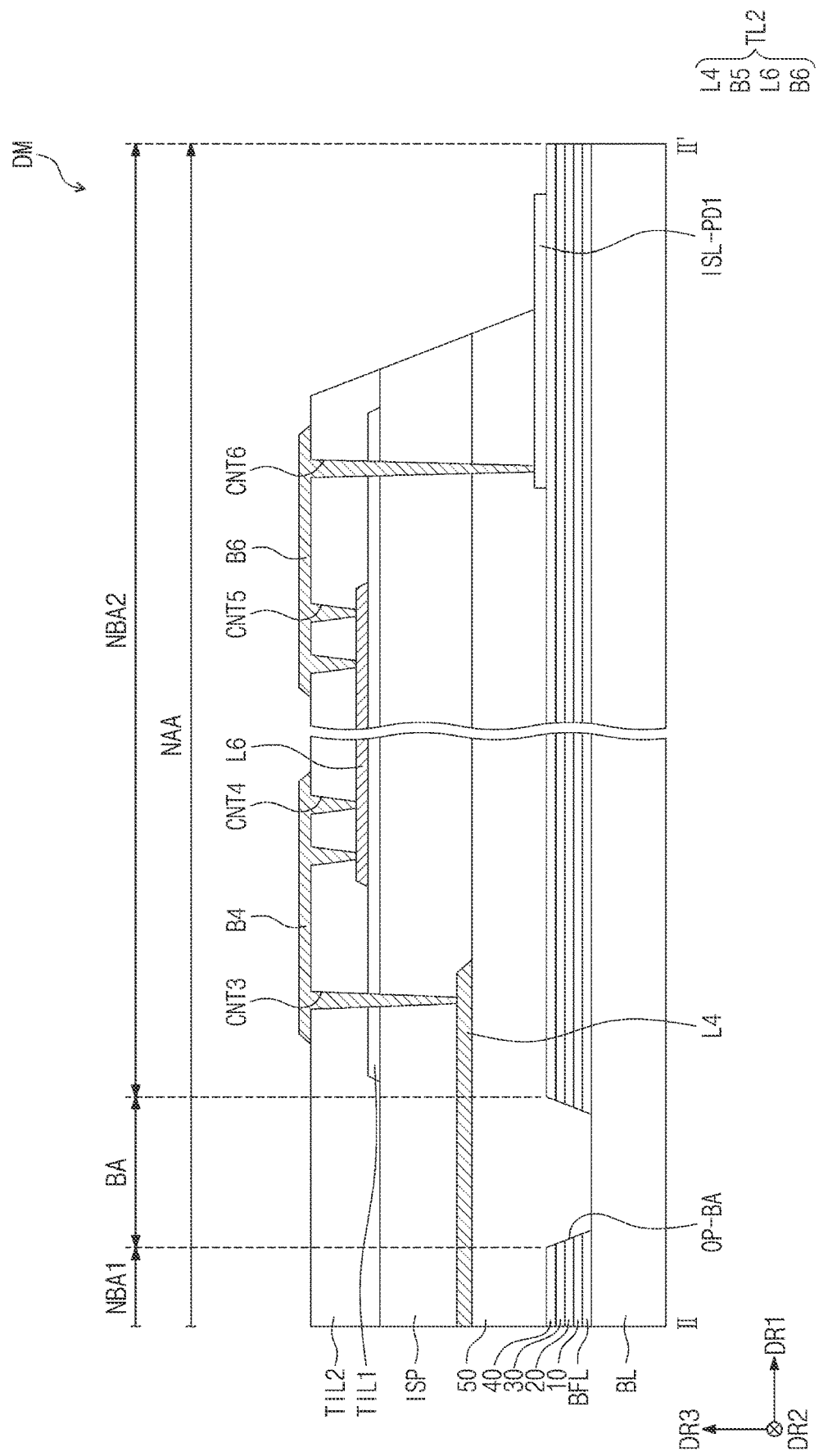

DISPLAY DEVICE

This U.S. non-provisional patent application claims priority under 35 U.S.C. § 119 to Korean Patent Application No. 10-2022-0067399, filed on Jun. 2, 2022, the contents of which are hereby incorporated by reference in its entirety.

BACKGROUND

1. Field of Disclosure

The present disclosure relates to a display device. More particularly, the present disclosure relates to a display device with improved sensing reliability.

2. Description of the Related Art

Electronic devices providing images to a user, such as smartphones, digital cameras, notebook computers, navigation units, and televisions, include a display device to display the images. The display device includes a display panel generating and displaying the images and an input device such as a keyboard, a mouse, an input sensor, etc.

The input sensor is disposed on the display panel and generates an input signal when the user touches a screen of the display device. The input signal generated by the input sensor is applied to the display panel, and the display panel provides images corresponding to the input signal to the user in response to the input signal applied thereto from the input sensor.

SUMMARY

The present disclosure provides a display device with reduced cost by simplifying a manufacturing process of an input sensor.

The present disclosure provides a display device with improved sensing reliability by reducing a short-circuit defect rate of the input sensor.

Embodiments of the inventive concept provide a display device including a display panel including a first non-bending area including pixels, a bending area bent with respect to an imaginary axis, and a second non-bending area spaced apart from the first non-bending area with the bending area interposed therebetween in a first direction and an input sensor disposed on the display panel and including sensing electrodes overlapping the first non-bending area, a first trace line connected to a corresponding sensing electrode among the sensing electrodes, and a second trace line connected to a corresponding sensing electrode among the sensing electrodes. The first trace line includes a first line portion overlapping the first non-bending area, a second line portion crossing the bending area and disposed on a layer different from the first line portion, and a first bridge overlapping the first non-bending area, connecting the first line portion to the second line portion, and disposed on a layer different from the first line portion and the second line portion. The second trace line includes a third line portion overlapping the first non-bending area, a fourth line portion crossing the bending area and disposed on a layer different from the third line portion, and a second bridge overlapping the first non-bending area, connecting the third line portion to the fourth line portion, and disposed on a layer different from the third line portion and the fourth line portion. The first bridge and the second bridge do not overlap each other when viewed in a second direction perpendicular to the first direction.

The input sensor includes a first sensing insulating layer disposed on the display panel and a second sensing insulating layer disposed on the first sensing insulating layer. The first line portion and the third line portion are disposed on the first sensing insulating layer, and the first bridge and the second bridges are disposed on the second sensing insulating layer.

The first sensing insulating layer includes an inorganic material and the second sensing insulating layer includes an organic material.

The sensing electrodes include a first sensing electrode including first sensing patterns disposed on the first sensing insulating layer and a connection pattern disposed on the second sensing insulating layer and connected to the first sensing patterns disposed adjacent each other via a contact hole defined through the second sensing insulating layer and a second sensing electrode insulated from the first sensing electrode and disposed on the first sensing insulating layer.

Each of the pixels includes a transistor and a light emitting element connected to the transistor. The display panel further includes a first organic insulating layer disposed on the transistor and a second organic insulating layer disposed on the first organic insulating layer. The second line portion and the fourth line portion are disposed on the first organic insulating layer, and the light emitting element is disposed on the second organic insulating layer.

The display panel further includes at least one dam pattern that does not overlap the pixels and is disposed in the first non-bending area, and a width in the second direction of each of a portion of the first line portion and a portion of the third line portion overlapping the at least one dam pattern is greater than a width in the second direction each of the other portion of the first line portion and the other portion of the third line portion when viewed in a plane.

The light emitting element includes a lower electrode disposed on the second organic insulating layer and an upper electrode disposed on the lower electrode, the display panel further includes a pixel definition layer disposed on the second organic insulating layer and provided with a light emitting opening through which at least a portion of the lower electrode is exposed, and the dam pattern includes a same material as at least one of the first organic insulating layer, the second organic insulating layer, and the pixel definition layer.

The first trace line further includes a fifth line portion overlapping the second non-bending area and disposed on a same layer as the first line portion and a third bridge overlapping the second non-bending area, disposed on a same layer as the first bridge, and connected to the second line portion and the fifth line portion. The second trace line further includes a sixth line portion overlapping the second non-bending area and disposed on a same layer as the third line portion and a fourth bridge overlapping the second non-bending area, disposed on a same layer as the third bridge, and connected to the fourth line portion and the sixth line portion, and the third bridge does not overlap the fourth bridge when viewed in the second direction.

A distance between the first bridge and the bending area is greater than a distance between the second bridge and the bending area when viewed in a plane, and a distance between the third bridge and the bending area is greater than a distance between the fourth bridge and the bending area when viewed in the plane.

A distance between the first bridge and the bending area is greater than a distance between the second bridge and the bending area when viewed in a plane, and a distance between the third bridge and the bending area is smaller than a distance between the fourth bridge and the bending area when viewed in the plane.

The display panel further includes sensing pads overlapping the second non-bending area and electrically connected to the first trace line and the second trace line, respectively, and the input sensor further includes a fifth bridge overlapping the second non-bending area, disposed on a same layer as the third bridge, and connected to the fifth line portion and a corresponding sensing pad among the sensing pads and a sixth bridge overlapping the second non-bending area, disposed on a same layer as the fourth bridge, and connected to the sixth line portion and a corresponding sensing pad among the sensing pads.

The fifth line portion includes a first portion connected to the third bridge and extending in the first direction, a second portion connected to the fifth bridge and extending in the first direction, and a third portion disposed between the first portion and the second portion, and extending in an oblique direction with respect to the first direction. The sixth line portion includes a fourth portion connected to the fourth bridge and extending in the first direction, a fifth portion connected to the sixth bridge and extending in the first direction, and a sixth portion disposed between the fourth portion and the fifth portion, and extending in the oblique direction.

A distance between the second portion and the fifth portion is greater than a distance between the first portion and the fourth portion, and a distance between the third portion and the sixth portion.

The fifth bridge is spaced apart from the sixth bridge in the second direction.

Each of the first trace line and the second trace line is provided in plural, and the first trace lines are alternately arranged with the second trace lines.

The input sensor further includes a third trace line disposed between the first trace line and the second trace line. The third trace line includes a first additional line portion overlapping the first non-bending area, a second additional line portion crossing the bending area and disposed on a layer different from the first additional line portion, and a first additional bridge overlapping the first non-bending area, connecting the first additional line portion and the second additional line portion, and disposed on a layer different from the first additional line portion and the second additional line portion. The first additional bridge does not overlap the first bridge and the second bridge when viewed in the second direction.

The first trace line further includes a fifth line portion overlapping the second non-bending area and disposed on a same layer as the first line portion and a third bridge overlapping the second non-bending area, disposed on a same layer as the first bridge, and connected to the second line portion and the fifth line portion. The second trace line further includes a sixth line portion overlapping the second non-bending area and disposed on a same layer as the third line portion and a fourth bridge overlapping the second non-bending area, disposed on a same layer as the second bridge, and connected to the fourth line portion and the sixth line portion. The third trace line includes a third additional line portion overlapping the second non-bending area and disposed on a same layer as the first additional line portion and a second additional bridge overlapping the second non-bending area, disposed on a same layer as the first additional bridge, and connected to the second additional line portion and the third additional line portion. The third and fourth bridges do not overlap the second additional bridge when viewed in the second direction.

A width in the second direction of each of the first bridge and the second bridge is greater than a width in the second direction of each of the first line portion, the second line portion, the third line portion, and the fourth line portion when viewed in a plane.

The display device further includes a polarizing film disposed on the input sensor and a window panel disposed on the polarizing film.

Embodiments of the inventive concept provide a display device including a base layer including a first non-bending area, a bending area bent with respect to an imaginary axis, and a second non-bending area spaced apart from the first non-bending area in a first direction with the bending area interposed therebetween, a plurality of light emitting elements disposed in the first non-bending area, a thin film encapsulation layer disposed in the first non-bending area and encapsulating the light emitting elements, sensing electrodes disposed in the first non-bending area and disposed on the thin film encapsulation layer, a first trace line disposed in the first non-bending area, the second non-bending area and the bending area, and connected to a corresponding sensing electrode among the sensing electrodes, and a second trace line disposed in the first non-bending area, the second non-bending area and the bending area, and connected to a corresponding sensing electrode among the sensing electrodes. The first trace line includes a first line portion disposed in the first non-bending area, a second line portion disposed in the bending area and disposed on a layer different from the first line portion, and a first bridge disposed in the first non-bending area, connecting the first line portion to the second line portion, and disposed on a layer different from the first line portion and the second line portion. The second trace line includes a third line portion disposed in the first non-bending area, a fourth line portion disposed in the bending area and disposed on a layer different from the third line portion, and a second bridge disposed in the first non-bending area, connecting the third line portion to the fourth line portion, and disposed on a layer different from the third line portion and the fourth line portion. A distance between the first bridge and the bending area is different from a distance between the second bridge and the bending area when viewed in a plane.

According to the above, as the trace lines of the input sensor include the bridge patterns that electrically connect the line portions disposed on different layers from each other, processes to form the contact hole are omitted. Accordingly, the manufacturing process of the input sensor is simplified, and the cost of the display device is reduced.

In addition, as the separation distance between the bridge patterns increases, a short-circuit caused by a residual layer containing an inorganic material or metal particles is prevented from occurring between the trace lines. Thus, the sensing reliability of the display device is improved.

BRIEF DESCRIPTION OF THE DRAWINGS

The above and other advantages of the present disclosure will become readily apparent by reference to the following detailed description when considered in conjunction with the accompanying drawings wherein:

FIG. 6B is a cross-sectional view of a display module take along a line II-II' of FIG. 5 according to an embodiment of the present disclosure;

DETAILED DESCRIPTION

Figure 1:
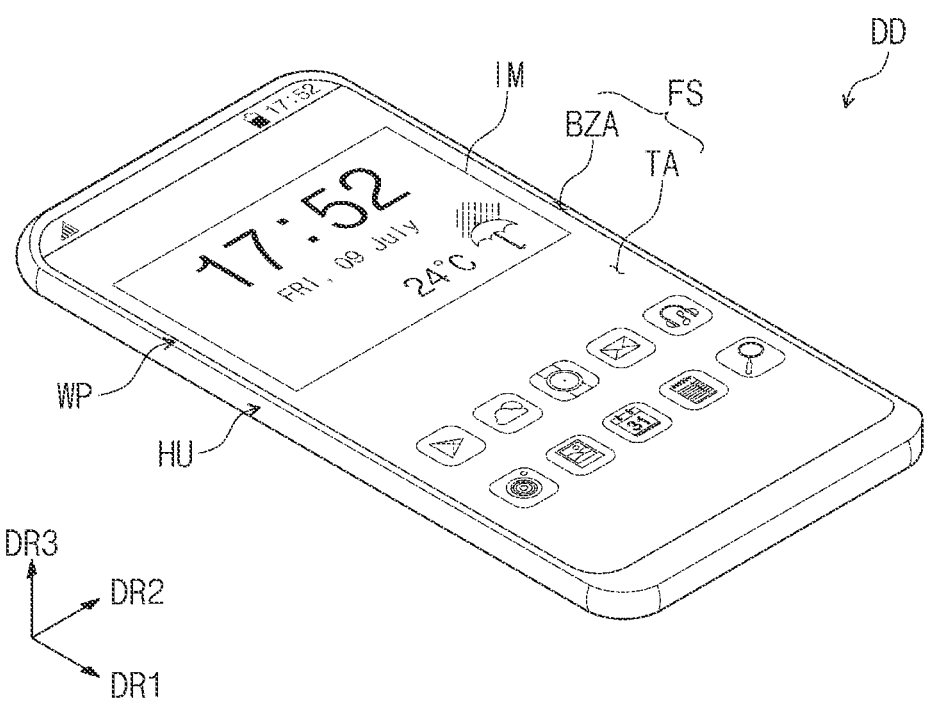
FIG. 1 is a perspective view of a display device according to an embodiment of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to accompanying drawings.

Figure 2:
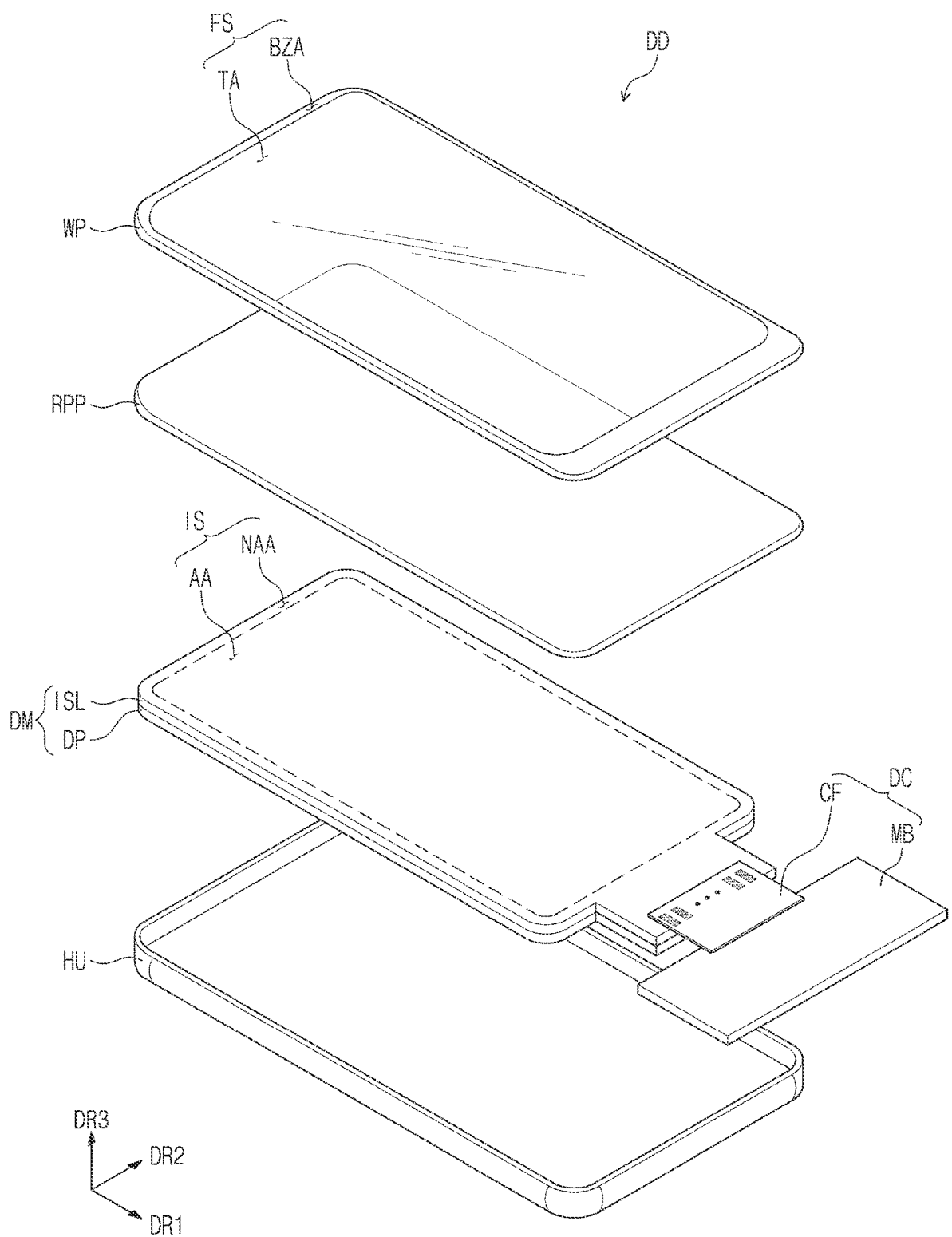
FIG. 2 is an exploded perspective view of a display device according to an embodiment of the present disclosure.

FIG. 1 is a perspective view of a display device DD according to an embodiment of the present disclosure. FIG. 2 is an exploded perspective view of the display device DD according to an embodiment of the present disclosure.

Referring to FIGS. 1 and 2, the display device DD may be a device that is activated in response to an electrical signal. The display device DD may include various embodiments. For example, the display device DD may be applied to electronic devices, such as a smart watch, a tablet computer, a notebook computer, a computer, a smart television set, etc. In the present embodiment, a smartphone will be described as a representative example of the display device DD.

The display device DD may display an image IM through a display surface FS, which is substantially parallel to each of a first direction DR1 and a second direction DR2, toward a third direction DR3. The image IM may include moving picture images and still images. FIG. 1 shows a clock widget and application icons as a representative example of the image IM. The display surface FS through which the image IM is displayed may correspond to a front surface of the display device DD and a front surface of a window panel WP.

In the present embodiment, front (or upper) and rear (or lower) surfaces of each constituent of the display device DD may be defined with respect to a direction in which the image IM is displayed. The front and rear surfaces may be opposite to each other in the third direction DR3, and a normal line direction of each of the front and rear surfaces may be substantially parallel to the third direction DR3. Meanwhile, directions indicated by the first, second, and third directions DR1, DR2, and DR3 may be relative to each other, and thus, the directions indicated by the first, second, and third directions DR1, DR2, and DR3 may be changed to other directions. In the following descriptions, the expression "when viewed in a plane" or "in a plan view" may mean a state of being viewed in the third direction DR3.

Referring to FIG. 2, the display device DD may include the window panel WP, a display module DM, a driving circuit DC, an optical film RPP, and a housing HU. The window panel WP and the housing HU may be coupled to each other to provide an exterior of the display device DD.

The window panel WP may include an optically transparent insulating material. For example, the window panel WP may include a glass or plastic material. The window panel WP may have a single-layer or multi-layer structure. As an example, the window panel WP may include a plurality of plastic films coupled to each other by an adhesive or a glass substrate and a plastic film coupled to the glass substrate by an adhesive.

The front surface of the window panel WP may define the display surface FS of the display device DD as described above. The display surface FS may include a transmissive area TA and a bezel area BZA. The transmissive area TA may be an optically transparent area. For example, the transmissive area TA may be an area having a visible light transmittance of about 90% or more.

The bezel area BZA may be an area having a relatively lower transmittance than that of the transmissive area TA. The bezel area BZA may define a shape of the transmissive area TA. The bezel area BZA may be disposed adjacent to the transmissive area TA and may surround the transmissive area TA.

The bezel area BZA may have a predetermined color. The bezel area BZA may cover a peripheral area NAA of the display module DM to prevent the peripheral area NAA from being viewed from the outside. However, this is merely an example, and the bezel area BZA may be omitted from the window panel WP according to an embodiment of the present disclosure.

The display module DM may display the image IM and may sense an external input. The display module DM may include a front surface IS in which an active area AA and the peripheral area NAA are defined. The active area AA may be an area activated in response to an electrical signal.

In the present embodiment, the active area AA may be an area through which the image IM is displayed and the external input is sensed. The transmissive area TA may overlap at least a portion of the active area AA. For example, the transmissive area TA may overlap an entire surface or at least a portion of the active area AA.

Accordingly, the user may view the image IM or may provide the external input through the transmissive area TA, however, this is merely an example. According to an embodiment, the active area AA of the display module DM may include an area through which the image IM is displayed and an area in which the external input is sensed, however, it should not be limited thereto or thereby.

The peripheral area NAA may be covered by the bezel area BZA. The peripheral area NAA may be disposed adjacent to the active area AA. The peripheral area NAA may surround the active area AA. A driving circuit or a driving line to drive the active area AA may be disposed in the peripheral area NAA.

The display module DM may include the display panel DP and an input sensor ISL. The display panel DP may generate the image IM. The image IM generated by the display panel DP may be viewed from outside by the user through the transmissive area TA.

The display panel DP may be a light emitting type display panel, however, it should not be particularly limited. For example, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot, a quantum rod, or a micro-LED. Hereinafter, the organic light emitting display panel will be described as the display panel DP.

The input sensor ISL may sense the external input applied thereto from the outside. The external input may include a variety of inputs provided from the outside of the display device DD. As an example, the external inputs may include a proximity input (e.g., hovering) applied when approaching close to or adjacent to the display device DD at a predetermined distance as well as a touch input by a part of the user's body (e.g., the user's hand). In addition, the external inputs may be provided in the form of force, pressure, light, etc., and it should not be particularly limited.

The driving circuit DC may include a flexible circuit board CF and a main circuit board MB. The flexible circuit board CF may be electrically connected to the display module DM. The flexible circuit board CF may connect the display module DM and the main circuit board MB, however, this is merely an example. According to an embodiment, the flexible circuit board CF may not be connected to the main circuit board MB, and the flexible circuit board CF may be a rigid substrate.

The flexible circuit board CF may be connected to pads of the display module DM which are disposed in the peripheral area NAA. The flexible circuit board CF may provide electrical signals to the display module DM to drive the display module DM. The electrical signals may be generated by the flexible circuit board CF or the main circuit board MB.

The main circuit board MB may include various driving circuits to drive the display module DM or a connector to supply power. The main circuit board MB may be connected to the display module DM via the flexible circuit board CF.

The optical film RPP may be disposed between the window panel WP and the display module DM. The optical film RPP may be coupled with the window panel WP by an adhesive layer. In addition, the optical film RPP may be coupled with the display module DM by an adhesive layer.

The optical film RPP may reduce a reflectance with respect to an external light incident thereto from above the window panel WP. The optical film RPP may include a retarder and/or a polarizer. The retarder may be a film type or liquid crystal coating type and may include a $\lambda/2$ retarder and/or a $\lambda/4$ retarder. The polarizer may be a film type or liquid crystal coating type. The film type polarizer and the film type retarder may include a stretching type synthetic resin film, and the liquid crystal coating type polarizer and the liquid crystal coating type retarder may include liquid crystals aligned in a predetermined alignment direction. The retarder and the polarizer may be implemented as one polarizing film.

The housing HU may be coupled with the window panel WP. The housing HU and the window panel WP coupled to the housing HU may provide a predetermined inner space. The display module DM may be accommodated in the inner space.

The housing HU may include a material with a relatively high rigidity. For example, the housing HU may include a glass, plastic, or metal material or a plurality of frames and/or plates of combinations thereof. The housing HU may stably protect the components of the display device DD accommodated in the inner space from external impacts.

Figure 3A:
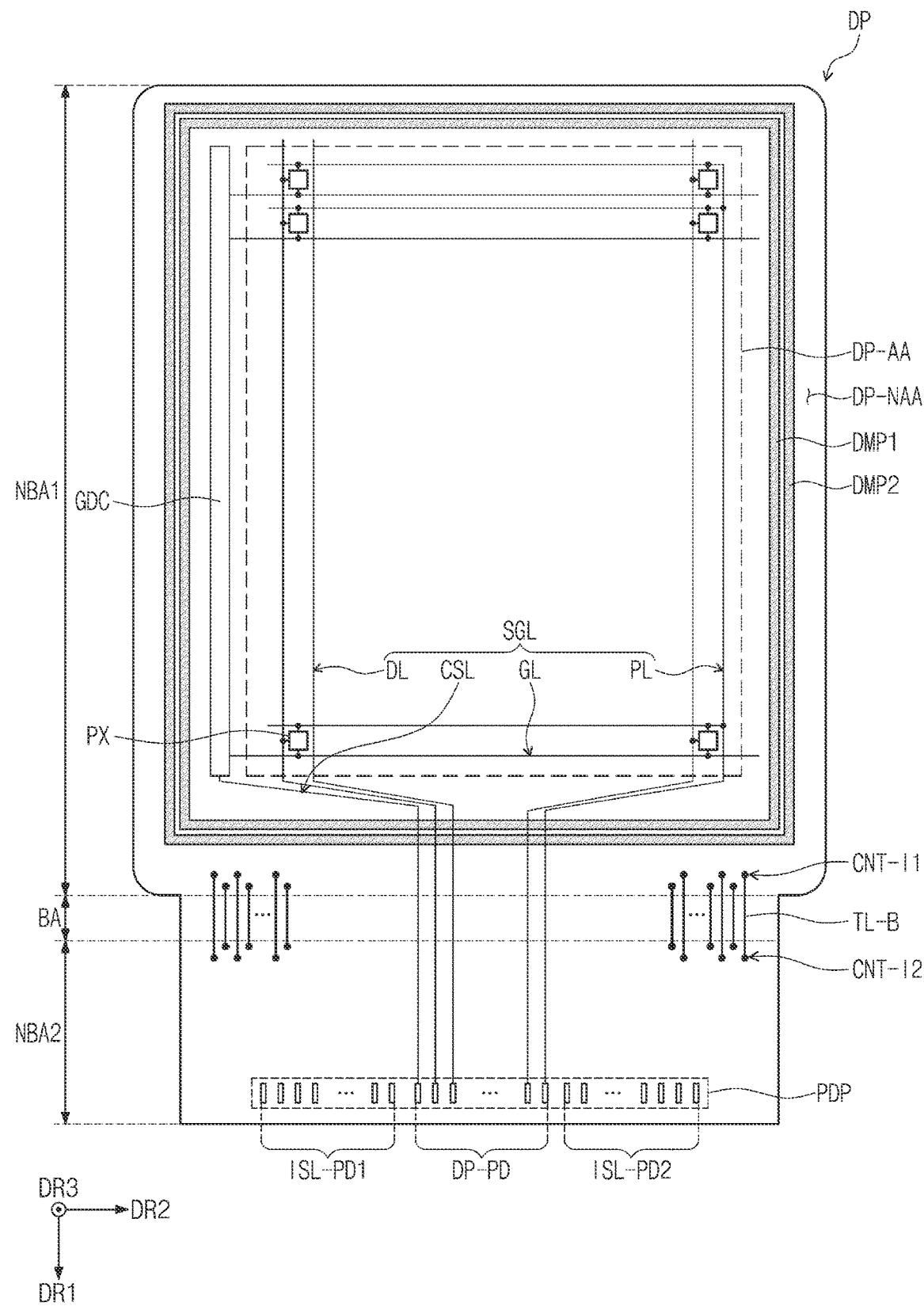
FIG. 3A is a plan view of a display panel according to an embodiment of the present disclosure.
Figure 3B:
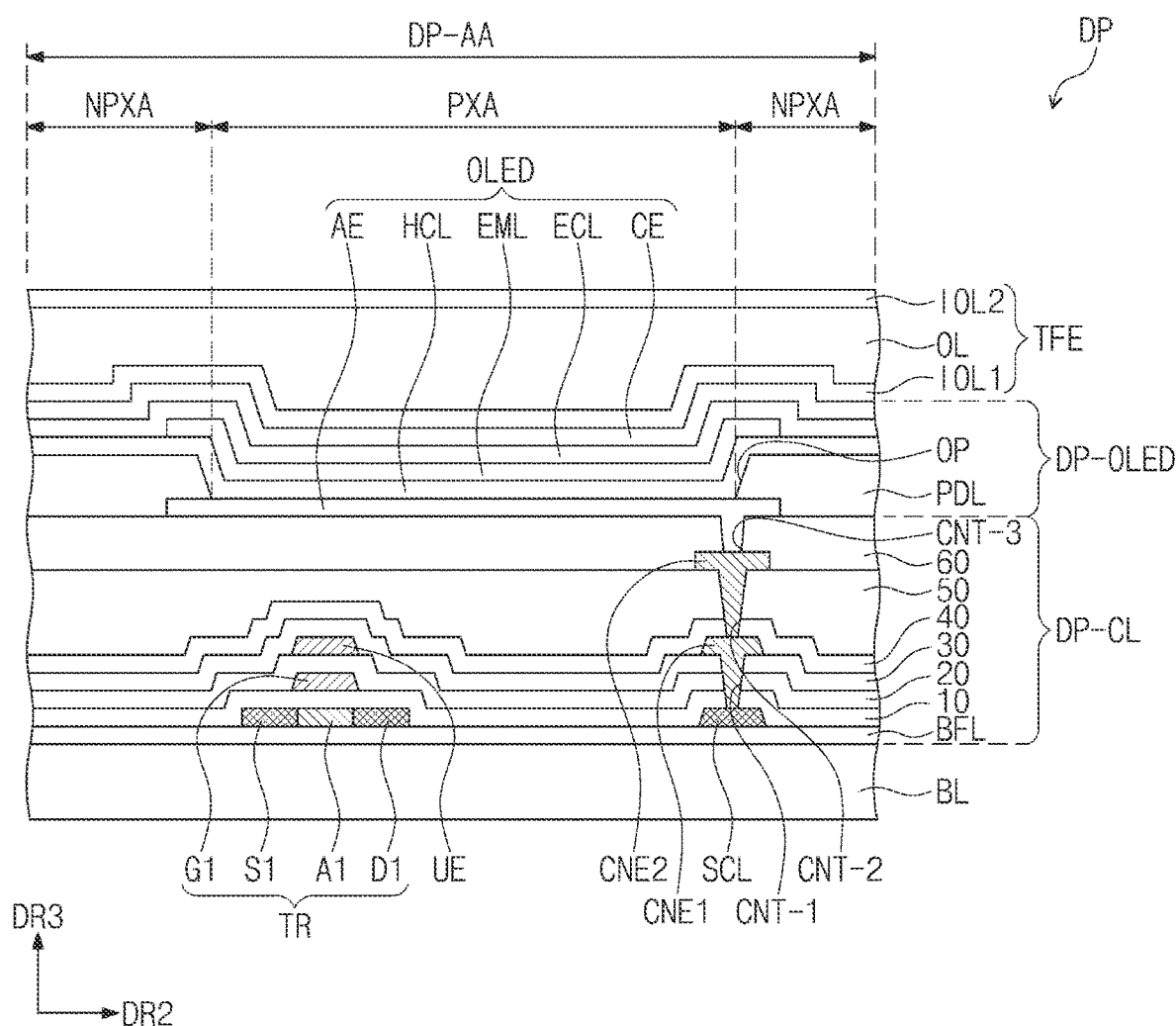
FIG. 3B is an enlarged cross-sectional view of a portion of an active area of a display panel according to an embodiment of the present disclosure.

FIG. 3A is a plan view of the display panel DP according to an embodiment of the present disclosure, and FIG. 3B is an enlarged cross-sectional view of a portion of an active area of the display panel DP according to an embodiment of the present disclosure.

Referring to FIG. 3A, the display panel DP may include an active area DP-AA and a peripheral area DP-NAA when viewed in the plane. The active area DP-AA of the display panel DP may be the area through which the image is displayed, and the peripheral area DP-NAA of the display panel DP may be the area in which the driving circuit or the driving line is disposed.

Light emitting elements of a plurality of pixels PX may be disposed in the active area DP-AA. The active area DP-AA may overlap at least a portion of the transmissive area TA (refer to FIG. 2), and the peripheral area DP-NAA may be covered by the bezel area BZA (refer to FIG. 2). The active area DP-AA and the peripheral area DP-NAA of the display panel DP may correspond to the active area AA and the peripheral area NAA of the display module DM shown in FIG. 2, respectively.

According to an embodiment, the display panel DP may include the pixels PX, a plurality of signal lines SGL, a scan driving circuit GDC, and a signal pad part PDP.

Each of the pixels PX may include a pixel circuit that includes a plurality of transistors and the light emitting element connected to the pixel circuit. Each of the pixels PX may emit light in response to an electrical signal applied thereto.

The signal lines SGL may include scan lines GL, data lines DL, a power line PL, and a control signal line CSL. Each of the scan lines GL may be connected to corresponding pixels among the pixels PX. Each of the data lines DL may be connected to corresponding pixels among the pixels PX. The power line PL may be connected to the pixels PX and may provide a power source voltage to the pixels PX. The control signal line CSL may apply control signals to the scan driving circuit.

The scan driving circuit GDC may be disposed in the peripheral area DP-NAA. The scan driving circuit GDC may generate scan signals and may sequentially output the scan signals to the scan lines GL. The scan driving circuit GDC may further output another control signal to the driving circuit of the pixels PX.

The scan driving circuit GDC may include a plurality of thin film transistors formed through the same process as the driving circuit of the pixels PX, for instance, a low temperature polycrystalline silicon (LTPS) process or a low temperature polycrystalline oxide (LTPO) process.

The display panel DP may include a first non-bending area NBA1, a bending area BA, and a second non-bending area NBA2 which are sequentially arranged in the first direction DR1. The first non-bending area NBA1 may be spaced apart from the second non-bending area NBA2 with the bending area BA interposed therebetween in the first direction DR1.

The first non-bending area NBA1 may include the active area DP-AA and a portion of the peripheral area DP-NAA. The peripheral area DP-NAA may include the bending area BA and the second non-bending area NBA2.

The bending area BA may be bent with respect to an imaginary axis extending in the second direction DR2. When the bending area BA is bent, the second non-bending area NBA2 may be disposed under the first non-bending area NBA1 to face the first non-bending area NBA1. According to an embodiment, a width in the second direction DR2 of the display panel DP may be smaller in the bending area BA than that in the first non-bending area NBA1.

The signal pad part PDP may be disposed adjacent to an edge of the second non-bending area NBA2. The signal pad part PDP may include display pads DP-PD and sensing pads ISL-PD1 and ISL-PD2.

The display pads DP-PD may be connected to ends of the signal lines SGL of the display panel DP, respectively. The display pads DP-PD may electrically connect the display panel DP to the flexible circuit board CF (refer to FIG. 2).

The sensing pads ISL-PD1 and ISL-PD2 may include first sensing pads ISL-PD1 and second sensing pads ISL-PD2 spaced apart from the first sensing pads ISL-PD1 with the display pads DP-PD interposed therebetween in the second direction DR2. The sensing pads ISL-PD1 and ISL-PD2 may be connected to ends of trace lines TL of the input sensor ISL described later with reference to FIG. 4B. The sensing pads ISL-PD1 and ISL-PD2 may electrically connect the input sensor ISL (refer to FIG. 2) and the flexible circuit board CF (refer to FIG. 2).

Bending line portions TL-B may be disposed on one of insulating layers of the display panel DP in the bending area BA. The bending line portions TL-B may serve as portions of the trace lines TL (refer to FIG. 4B). An end of each of the bending line portions TL-B may be connected to a portion of a corresponding trace line TL (refer to FIG. 4B), which is disposed in the first non-bending area NBA1, via a first input contact hole CNT-I1. In addition, the other end of each of the bending line portions TL-B may be connected to a portion of a corresponding trace line TL (refer to FIG. 4B), which is disposed in the second non-bending area NBA2, via the second input contact hole CNT-I2.

The display panel DP may include dam patterns DMP1 and DMP2. The dam patterns DMP1 and DMP2 may be disposed in the peripheral area DP-NAA of the first non-bending area NBA1 and may surround the active area DP-AA. Each of the dam patterns DMP1 and DMP2 may have a closed-line shape. The dam patterns DMP1 and DMP2 may serve as a dam to prevent a liquid organic material from overflowing during an inkjet process of the display panel DP.

FIG. 3A shows two dam patterns DMP1 and DMP2 as a representative example, however, the number of the dam patterns should not be particularly limited.

FIG. 3B is an enlarged cross-sectional view of a portion of the active area DP-AA of the display panel DP according to an embodiment of the present disclosure. Referring to FIG. 3B, the display panel DP may include a base layer BL, a circuit element layer DP-CL, a display element layer DP-OLED, and a thin film encapsulation layer TFE.

The base layer BL may serve as a base layer on which the circuit element layer DP-CL, the display element layer DP-OLED, and the thin film encapsulation layer TFE are stacked. The base layer BL may be flexible or rigid and may have a single-layer or multi-layer structure, and it should not be particularly limited.

The circuit element layer DP-CL may be disposed on the base layer BL. The circuit element layer DP-CL may include a plurality of insulating layers, a plurality of conductive layers, and a semiconductor layer. The circuit element layer DP-CL may be formed by a coating or depositing process to form an insulating layer, a semiconductor layer, and a conductive layer and a photolithography process to pattern the insulating layer, the semiconductor layer, and the conductive layer. The conductive layers of the circuit element layer DP-CL may form the signal lines or a control circuit of each of the pixels PX (refer to FIG. 3A).

The buffer layer BFL may include a plurality of inorganic layers stacked one another in a thickness direction. A transistor TR may include a semiconductor pattern and a gate G1, and the semiconductor pattern may be disposed on the buffer layer BFL. The buffer layer BFL may increase coupling force between the base layer BL and the semiconductor pattern.

The semiconductor pattern may include polysilicon, however, it should not be limited thereto or thereby. The semiconductor pattern may include an amorphous silicon or metal oxide. FIG. 3B shows a portion of the semiconductor pattern, and the semiconductor pattern may be further disposed in another area of the pixel PX when viewed in a plane. The semiconductor pattern may be arranged with a specific rule in the pixels PX (refer to FIG. 3A).

The semiconductor pattern may have different electrical properties depending on whether it is doped or not or whether it is doped with an N-type dopant or a P-type dopant. The semiconductor pattern may include a first region A1 with low doping concentration and low conductivity, and second regions S1 and D1 with relatively high doping concentration and high conductivity. One second region S1 may be disposed at one side of the first region A1, and the other second region S2 may be disposed at the other side of the first region A1. The second regions S1 and D1 may be doped with the N-type dopant or the P-type dopant. A P-type transistor may include a doped region doped with the P-type dopant. The first region A1 may be a non-doped region or may be doped at a concentration lower than the second regions S1 and D1.

The second regions S1 and D1 may substantially serve as an electrode or a signal line. The one second area S1 may correspond to a source of a transistor, and the other second area D1 may correspond to a drain of the transistor. FIG. 3B shows a portion of a connection signal line SCL formed of the semiconductor pattern. Although not shown in figures, the connection signal line SCL may be connected to the drain of the transistor TR when viewed in a plane.

A first insulating layer 10 may be disposed on the buffer layer BFL. The first insulating layer 10 may commonly overlap the pixels PX (refer to FIG. 3A) and may cover the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon oxynitride, zirconium oxide, and hafnium oxide. Not only the first insulating layer 10 but also an insulating layer of the circuit element layer DP-CL described later may be an inorganic layer and/or an organic layer and may have a single-layer or multi-layer structure.

The gate G1 may be disposed on the first insulating layer 10. The gate G1 may be a portion of a metal pattern. The gate G1 may overlap the first area A1. The gate G1 may be used as a self-aligned mask in a process of doping the semiconductor pattern.

A second insulating layer 20 may be disposed on the first insulating layer 10 and may cover the gate G1. The second insulating layer 20 may commonly overlap the pixels PX (refer to FIG. 3A). An upper electrode UE may be disposed on the second insulating layer 20. The upper electrode UE may overlap the gate G1. The upper electrode UE may include a plurality of metal layers. According to an embodiment, the upper electrode UE may be omitted.

A third insulating layer 30 may be disposed on the second insulating layer 20 and may cover the upper electrode UE. A first connection electrode CNE1 may be disposed on the third insulating layer 30. The first connection electrode CNE1 may be connected to the connection signal line SCL via a contact hole CNT-1 defined through the first, second, and third insulating layers 10, 20, and 30.

A fourth insulating layer 40 may be disposed on the third insulating layer 30. A fifth insulating layer 50 may be disposed on the fourth insulating layer 40. The fifth insulating layer may be an organic layer. The fifth insulating layer 50 may be referred to as a first organic insulating layer.

A second connection electrode CNE2 may be disposed on the fifth insulating layer 50. The second connection electrode CNE2 may be connected to the first connection electrode CNE1 via a contact hole CNT-2 defined through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer. The sixth insulating layer 60 may be referred to as a second organic insulating layer. The bending line portions TL-B described with reference to FIG. 3A may be disposed on the same layer as a layer on which the second connection electrode CNE2 is disposed.

The display element layer DP-OLED may include a light emitting element OLED and a pixel definition layer PDL. The light emitting element OLED may be disposed on the sixth insulating layer 60. The light emitting element OLED may include a lower electrode AE, a hole control layer HCL, a light emitting layer EML, an electron control layer ECL, and an upper electrode CE.

The lower electrode AE may be disposed on the sixth insulating layer 60. The lower electrode AE may be connected to the second connection electrode CNE2 via a contact hole CNT-3 defined through the sixth insulating layer 60.

The pixel definition layer PDL may be disposed on the sixth insulating layer 60. A light emitting opening OP may be defined through the pixel definition layer PDL, and at least a portion of the lower electrode AE may be exposed without being covered by the pixel definition layer PDL. The pixel definition layer PDL may be an organic layer.

As shown in FIG. 3B, the active area DP-AA may include a light emitting area PXA and a non-light-emitting area NPXA disposed adjacent to the light emitting area PXA. In the present embodiment, the light emitting area PXA may be defined to correspond to the portion of the first electrode AE which is exposed through the light emitting opening OP. The non-light-emitting area NPXA may surround the light emitting area PXA.

A hole control layer HCL may be commonly disposed in the light emitting area PXA and the non-light-emitting area NPXA. The hole control layer HCL may include a hole transport layer and may further include a hole injection layer. A light emitting layer EML may be disposed on the hole control layer HCL. The light emitting layer EML may be disposed in an area corresponding to the light emitting opening OP. That is, the light emitting layers EML disposed in the pixels PX (refer to FIG. 3A) may be separated one another.

An electron control layer ECL may be disposed on the light emitting layer EML. The electron control layer ECL may be commonly disposed in the light emitting area PXA and the non-light-emitting area NPXA. The electron control layer ECL may include an electron transport layer and may further include an electron injection layer. The hole control layer HCL and the electron control layer ECL may be commonly disposed over the pixels PX (refer to FIG. 3A) using an open mask.

An upper electrode CE may be disposed on the electron control layer ECL. The upper electrode CE may have an integral shape and may be commonly disposed over the pixels PX (refer to FIG. 3A).

The thin film encapsulation layer TFE may be disposed on the display element layer DP-OLED and may include a plurality of thin layers. According to an embodiment, the thin film encapsulation layer TFE may include a first encapsulation inorganic layer IOL1, an encapsulation organic layer OL disposed on the first encapsulation inorganic layer IOL1, and a second encapsulation inorganic layer IOL2 disposed on the encapsulation organic layer OL. The first encapsulation inorganic layer IOL1 and the second encapsulation inorganic layer IOL2 may protect the display element layer DP-OLED from moisture and oxygen, and the encapsulation organic layer OL may protect the display element layer DP-OLED from a foreign substance such as dust particles.

Figure 4A:
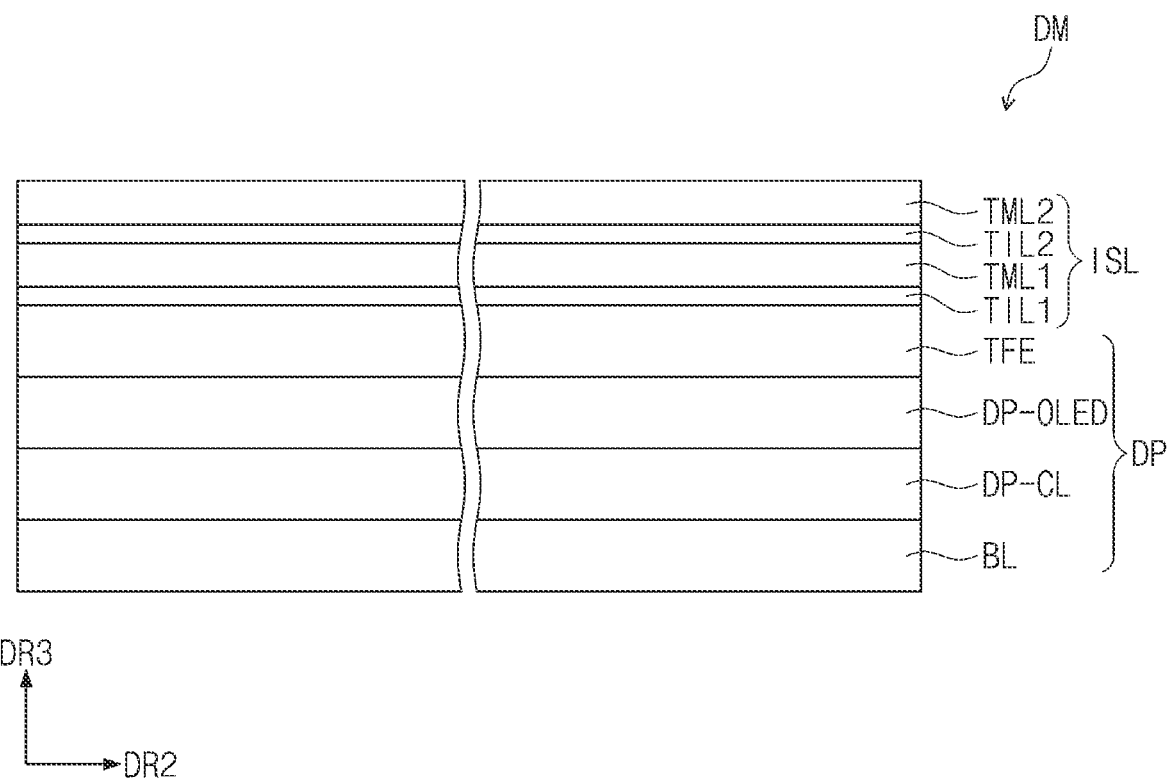
FIG. 4A is a cross-sectional view of a display module according to an embodiment of the present disclosure.
Figure 4B:
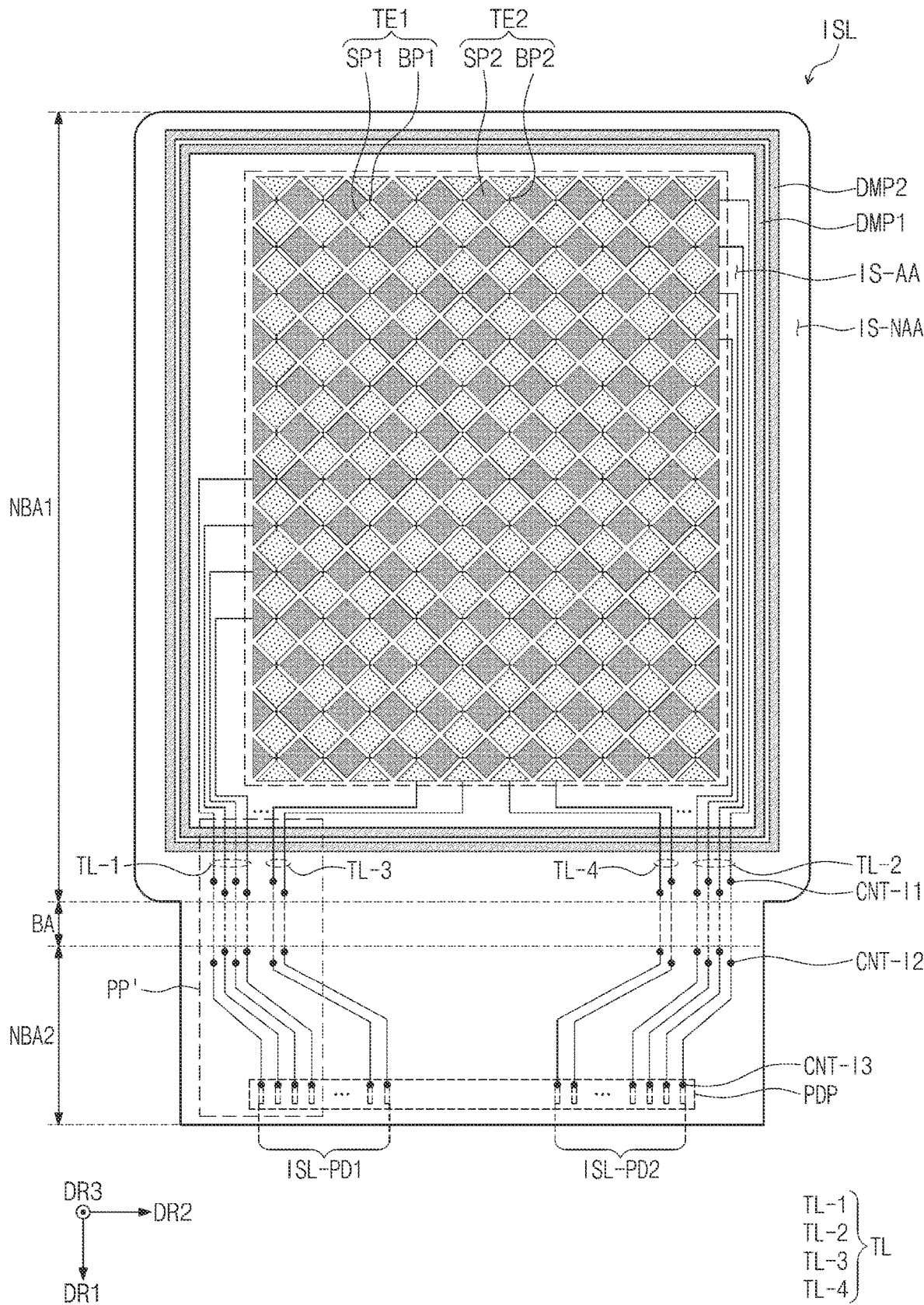
FIG. 4B is a plan view of an input sensor according to an embodiment of the present disclosure.

FIG. 4A is a cross-sectional view of the display module DM according to an embodiment of the present disclosure. FIG. 4B is a plan view of the input sensor ISL according to an embodiment of the present disclosure. In FIGS. 4A and 4B, the same/similar reference numerals denote the same/similar elements in FIGS. 1 to 3B, and thus, detailed descriptions of the same/similar elements will be omitted.

Referring to FIG. 4A, the display module DM may include the display panel DP and the input sensor ISL disposed on the display panel DP. The input sensor ISL may be disposed on the thin film encapsulation layer TFE. The input sensor ISL may include a first sensing insulating layer TIL1 a first sensing conductive layer TML1, a second sensing insulating layer TIL2, and a second sensing conductive layer TML2.

The first sensing insulating layer TIL1 may be disposed directly on the thin film encapsulation layer TFE. According to an embodiment, the first sensing insulating layer TIL1 may be disposed on the second encapsulation inorganic layer IOL2 (refer to FIG. 3B). The second sensing insulating layer TIL2 may be disposed on the first sensing insulating layer TIL1. Meanwhile, according to an embodiment, the first sensing insulating layer TIL1 of the input sensor ISL may be omitted.

Each of the first and second sensing insulating layers TIL1 and TIL2 may include an inorganic layer or an organic layer. According to an embodiment, the first sensing insulating layer TIL1 may include the inorganic layer containing an inorganic material. The inorganic layer may include at least one of aluminum oxide, titanium oxide, silicon oxide, silicon oxynitride, zirconium oxide, and hafnium oxide. The second sensing insulating layer TIL2 may include the organic layer containing an organic material. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The first sensing conductive layer TML1 may be disposed on the first sensing insulating layer TIL1 and may be covered by the second sensing insulating layer TIL2. The second sensing conductive layer TML2 may be disposed on the second sensing insulating layer TIL2. In the present embodiment, the second sensing conductive layer TML2 may be disposed at an uppermost position of the input sensor ISL.

Each of the first sensing conductive layer TML1 and the second sensing conductive layer TML2 may have a single-layer structure or a multi-layer structure. The conductive layer having the multi-layer structure may include two or more layers of a transparent conductive layer and a metal layer. The conductive layer having the multi-layer structure may include metal layers containing different metals from each other.

The first and second sensing conductive layers TML1 and TML2 may include at least one of indium tin oxide (ITO), indium zinc oxide (IZO), zinc oxide (ZnO), indium tin zinc oxide (ITZO), polyethylenedioxythiophene (PEDOT), metal nanowire, and graphene as the transparent conductive layer. The first and second sensing conductive layers TML1 and TML2 may include molybdenum (Mo), silver (Ag), titanium (Ti), copper (Cu), aluminum (Al), and alloys thereof as the metal layer.

As an example, each of the first and second sensing conductive layers TML1 and TML2 may have a three-layer structure of titanium/aluminum/titanium. Metals with a relatively high durability and a low reflectance may be applied as an outer layer of the conductive layer, and metals with a high electrical conductivity may be applied as an inner layer of the conductive layer.

Referring to FIG. 4B, the input sensor ISL may include an active area IS-AA and a peripheral area IS-NAA disposed adjacent to the active area IS-AA. The active area IS-AA and the peripheral area IS-NAA of the input sensor ISL may correspond to the active area DP-AA (refer to FIG. 3A) and the peripheral area DP-NAA (refer to FIG. 3A) of the display panel DP (refer to FIG. 3A), respectively. For the convenience of explanation, FIG. 4B shows the first non-bending area NBA1, the bending area BA, and the second non-bending area NBA2 of the display panel DP (refer to FIG. 3A).

According to an embodiment, the input sensor ISL may include a plurality of sensing electrodes TE1 and TE2 and a plurality of trace lines TL respectively connected to the sensing electrodes TE1 and TE2. The sensing electrodes TE1 and TE2 may include first sensing electrode TE1 and second sensing electrode TE2.

The first sensing electrodes TE1 may extend in the first direction DR1 and may be arranged in the second direction DR2. The first sensing electrodes TE1 may include first sensing patterns SP1 and first conductive patterns BP1. The first sensing patterns SP1 may be arranged in the first direction DR1. At least one first conductive pattern BP1 may be connected to two first sensing patterns SP1 adjacent to each other along the first direction DR1 and may be referred to as a connection pattern.

The second sensing electrodes TE2 may extend in the second direction DR2 and may be arranged in the first direction DR1. The second sensing electrodes TE2 may include second sensing patterns SP2 and second conductive patterns BP2. The second sensing patterns SP2 may be arranged in the second direction DR2. At least one second conductive pattern BP2 may be disposed between two second sensing patterns SP2 adjacent to each other along the second direction DR2. According to an embodiment, the second sensing patterns SP2 and the second conductive patterns BP2 may be patterned through the same process and may be provided integrally with each other.

According to an embodiment, the first sensing patterns SP1, the second sensing patterns SP2, and the second conductive patterns BP2 may be included in the first sensing conductive layer TML1 described with reference to FIG. 4A. That is, the first sensing patterns SP1, the second sensing patterns SP2, and the second conductive patterns BP2 may be disposed on the first sensing insulating layer TIL1 and may be covered by the second sensing insulating layer TIL2. The first conductive patterns BP1 may be included in the second sensing conductive layer TML2 described with reference to FIG. 4A. That is, the first conductive patterns BP1 may be disposed on the second sensing insulating layer TIL2 and may be disposed at an uppermost position of the input sensor ISL.

According to the input sensor ISL of the present disclosure, a mask process to form a separate insulating layer covering the second sensing conductive layer TML2 may be omitted. Accordingly, a method of manufacturing the display module DM may be simplified, and thus, a manufacturing cost of the display module DM may be reduced.

However, as the second sensing conductive layer TML2 is not covered by the insulating layer, there is a high possibility that the second sensing conductive layer TML2 will be damaged by an external impact or a foreign substance applied from the outside. According to the present embodiment, since the first sensing patterns SP1 and the second sensing electrodes TE2 are disposed on the first sensing insulating layer TIL1 and the first conductive patterns BP1 is disposed on the second sensing insulating layer TIL2, the damage of the sensing electrodes TE1 and TE2 may be reduced. In this case, each of the first sensing patterns SP1, the second sensing patterns SP2, and the second conductive patterns BP2 may have a thickness greater than a thickness of each of the first conductive patterns BP1 when viewed in a cross-section.

The trace lines TL may extend from the sensing electrodes TE1 and TE2, respectively. The trace lines TL may electrically connect the sensing electrodes TE1 and TE2 to the sensing pads ISL-PD1 and ISL-PD2, respectively. Accordingly, the sensing electrodes TE1 and TE2 may be electrically connected to the main circuit board MB (refer to FIG. 2) via the flexible circuit board CF (refer to FIG. 2).

Each of the trace lines TL may include an upper portion disposed on one of the first and second sensing insulating layers TIL1 and TIL2 (refer to FIG. 4A) in the first non-bending area NBA1, a connection portion disposed on one of the insulating layers of the display panel DP (refer to FIG. 3A) in the bending area BA, and a lower portion disposed on one of the first and second sensing insulating layers TIL1 and TIL2 (refer to FIG. 4A) in the second non-bending area NBA2.

In FIG. 4B, the upper portion and the lower portion are indicated by a solid line, and the connection portion is indicated by a dotted line. The connection portion of FIG. 4B may correspond to the bending line portions TL-B described with reference to FIG. 3A.

The upper portion and the connection portion may be connected to each other via the first input contact hole CNT-I1 in the first non-bending area NBA1, and the connection portion and the lower portion may be connected to each other via the second input contact hole CNT-I2 in the second non-bending area NBA2.

According to an embodiment, the trace lines TL may include first, second, third, and fourth group lines TL-1, TL-2, TL-3, and TL-4.

The first group lines TL-1 may be electrically connected to ends of some second sensing electrodes TE2, respectively. The second group lines TL-2 may be electrically connected to ends of remaining second sensing electrodes TE2 which are not connected to the first group lines TL-1, respectively.

As an example, the first group lines TL-1 may be electrically connected to the ends of the some second sensing electrodes disposed at a lower left end among the second sensing electrodes TE2, and the second group lines TL-2 may be electrically connected to the ends of remaining sensing electrodes TE2 disposed at an upper right end among the second sensing electrodes TE2.

The third group lines TL-3 may be electrically connected to ends of some electrodes of the first sensing electrodes TEL The fourth group lines TL-4 may be electrically connected to ends of remaining electrodes of the first sensing electrodes TE1 which are not connected to the third group lines TL-3. The ends of the first sensing electrodes TE1 to which the third and fourth group lines TL-3 and TL-4 are electrically connected may be disposed adjacent to the bending area BA.

As an example, the third group lines TL-3 may be electrically connected to ends of the first sensing electrodes disposed at a left side among the first sensing electrodes TE1, and the fourth group lines TL-4 may be electrically connected to ends of the first sensing electrodes disposed at a right side among the first sensing electrodes TE1.

The upper portion of each of the first, second, third, and fourth group lines TL-1, TL-2, TL-3, and TL-4 may extend from a corresponding sensing electrode of the sensing electrodes TE1 and TE2 toward the bending area BA in the first non-bending area NBA1.

As an example, the upper portion of each of the first and third group lines TL-1 and TL-3 may be disposed at a left portion of the first non-bending area NBA1 disposed between the sensing electrodes TE1 and TE2 and the dam patterns DMP1 and DMP2. The upper portion of each of the second and fourth group lines TL-2 and TL-4 may be disposed at a right portion of the first non-bending area NBA1 disposed between the sensing electrodes TE1 and TE2 and the dam patterns DMP1 and DMP2. The upper portion of each of the first, second, third, and fourth group lines TL-1, TL-2, TL-3, and TL-4 may extend in the first direction DR1 between the sensing electrodes TE1 and TE2, and the dam patterns DMP1 and DMP2 toward the bending area BA when viewed in the plane.

The lower portion of each of the first, second, third, and fourth group lines TL-1, TL-2, TL-3, and TL-4 may be connected to corresponding sensing pads of the sensing pads ISL-PD1 and ISL-PD2. As an example, the lower portion of each of the first and third group lines TL-1 and TL-3 may be electrically connected to a corresponding first sensing pad among the first sensing pads ISL-PD1, and the lower portion of each of the second and fourth group lines TL-2 and TL-4 may be electrically connected to a corresponding second sensing pad among the second sensing pads ISL-PD2.

The lower portion of each of the first, second, third, and fourth group lines TL-1, TL-2, TL-3, and TL-4 may be connected to the corresponding sensing pad via the third input contact hole CNT-I3.

According to an embodiment, the lower portion of each of the first, second, third, and fourth group lines TL-1, TL-2, TL-3, and TL-4 may include a portion extending in the first direction DR1 and a portion extending in an oblique direction with respect to the first direction DR1. The shape of the trace lines TL will be described in detail later.

Figure 5:
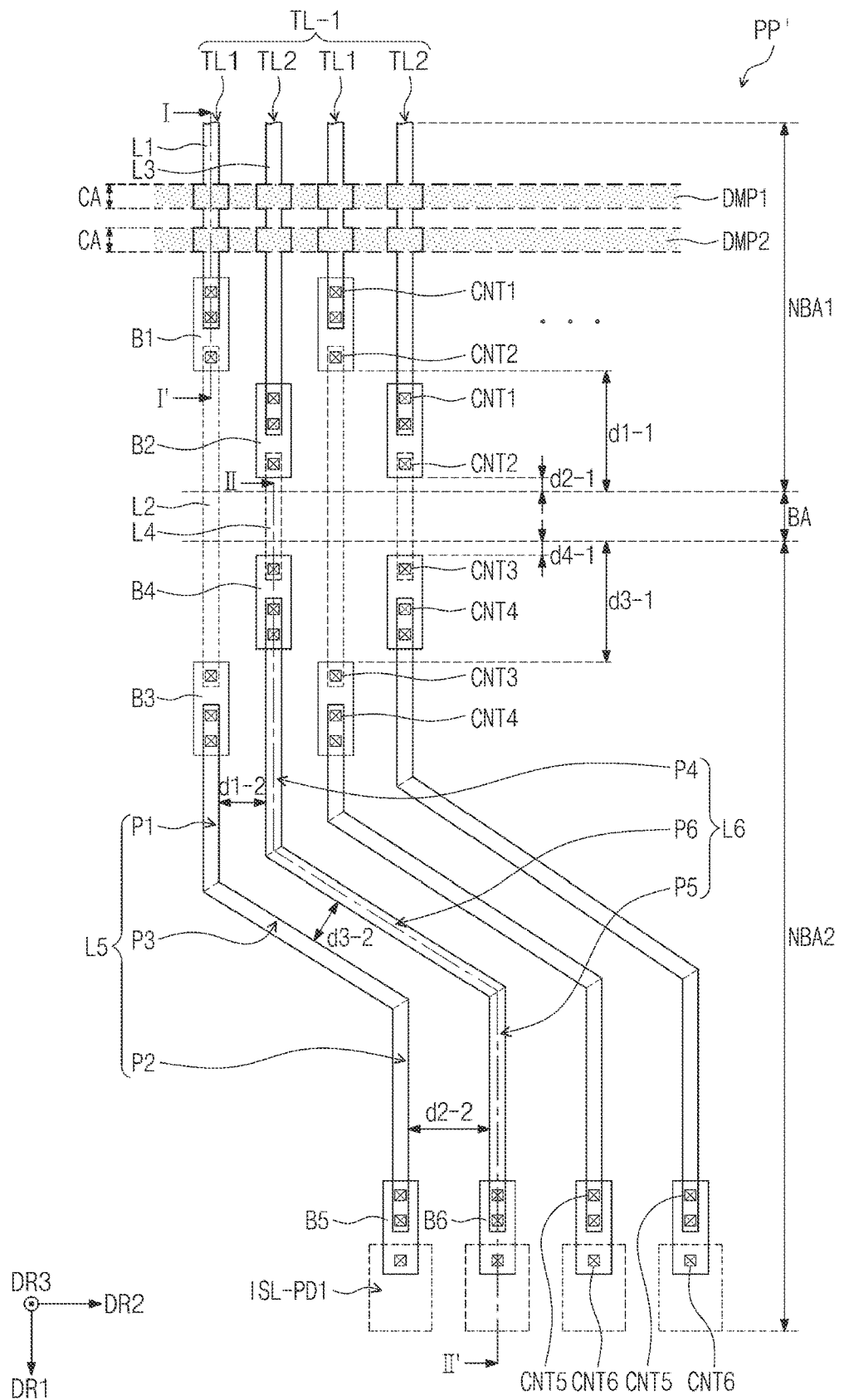
FIG. 5 is an enlarged plan view of an area PP' of FIG. 4B of a display module according to an embodiment of the present disclosure.
Figure 6A:
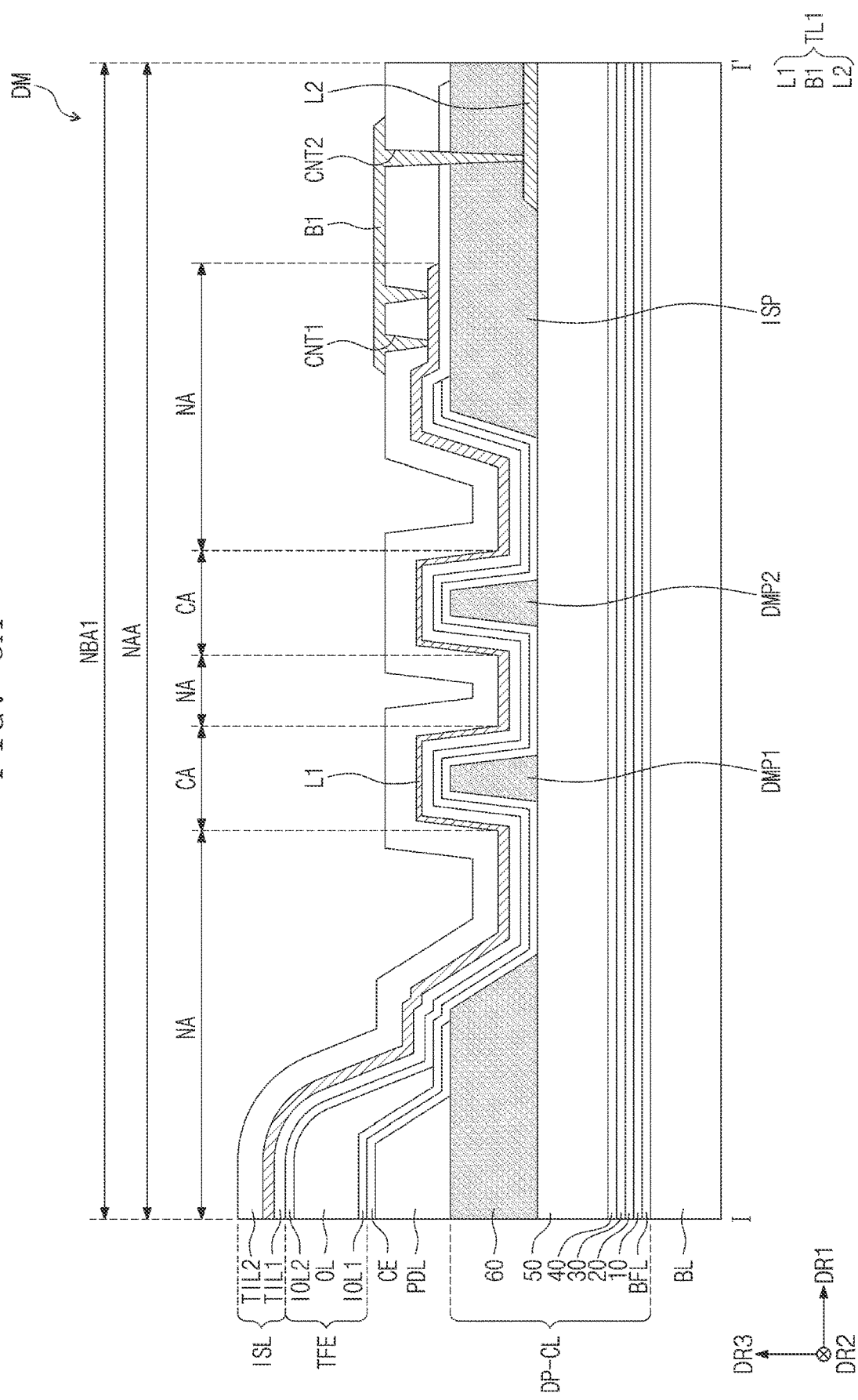
FIG. 6A is a cross-sectional view of a display module take along a line I-I' of FIG. 5 according to an embodiment of the present disclosure.

FIG. 5 is an enlarged plan view of an area PP' of FIG. 4B of the display module according to an embodiment of the present disclosure. FIG. 6A is a cross-sectional view of the display module DM take along a line I-I' of FIG. 5 according to an embodiment of the present disclosure. FIG. 6B is a cross-sectional view of the display module DM take along a line II-II' of FIG. 5 according to an embodiment of the present disclosure.

FIG. 5 shows a portion of the first group lines TL-1 among the trace lines TL shown in FIG. 4B. FIG. 5 shows only the first group lines TL-1 as a representative example, and hereinafter, descriptions on the first group lines TL-1 may be equally/similarly applied to the second, third, and fourth group lines TL-2, TL-3, and TL-4 (refer to FIG. 4B). FIG. 6A shows a cross-section of the display module DM corresponding to the peripheral area NAA of the first non-bending area NBA1, and FIG. 6B shows a cross-section of the display module DM corresponding to a portion of the peripheral area NAA of the first non-bending area NBA1, the bending area BA, and the second non-bending area NBA2. Hereinafter, a stack structure of the display module DM and a structure and shape of the trace lines TL in the peripheral area NAA will be described in detail with reference to FIGS. 5 to 6B.

Referring to FIGS. 6A and 6B, the base layer BL, the buffer layer BFL, and the first to fifth insulating layers 10 to 50 of the display panel DP may be entirely disposed in the peripheral area NAA of the first non-bending area NBA1 and the second non-bending area NBA2. The fifth insulating layer 50 including the organic material may be disposed in the bending area BA, however, the buffer layer BFL including the inorganic material and the first to fourth insulating layers 10 to 40 may not be disposed in the bending area BA.

The buffer layer BFL and the first to fourth insulating layers 10 to 40 may be provided with a bending opening OP-BA defined therethrough in the bending area BA. The bending opening OP-BA may be formed by stacking the buffer layer BFL and the first to fourth insulating layers 10 to 40 and etching the buffer layer BFL and the first to fourth insulating layers 10 to 40. Accordingly, a portion of the fifth insulating layer 50 may be disposed inside the bending opening OP-BA.

According to an embodiment, the sixth insulating layer 60, the pixel definition layer PDL, and the encapsulation organic layer OL of the display panel DP may not be disposed in the portion of the peripheral area NAA of the first non-bending area NBA1, the bending area BA, and the second non-bending area NBA2. The first and second encapsulation inorganic layers IOL1 and IOL2 may be in direct contact with each other in an area, where the encapsulation organic layer OL is not disposed, of the peripheral area NAA of the first non-bending area NBA1 and may encapsulate the encapsulation organic layer OL. A portion of the first encapsulation inorganic layer IOL1 may be in direct contact with the fifth insulating layer 50.

In the present embodiment, the display panel DP may include the dam patterns DMP1 and DMP2 and an insulating pattern ISP.

The dam patterns DMP1 and DMP2 may be formed through the same process as the sixth insulating layer 60. That is, the dam patterns DMP1 and DMP2 may be disposed on the fifth insulating layer 50 and may include the same material as the sixth insulating layer 60.

However, the present disclosure should not be limited thereto or thereby. According to an embodiment, similar to the sixth insulating layer 60, the fifth insulating layer 50 may be disposed only in the first non-bending area NBA1, and in this case, the dam patterns DMP1 and DMP2 may be formed through the same process as the fifth insulating layer 50 and may include the same material as the fifth insulating layer 50. According to an embodiment, the sixth insulating layer 60 may be entirely disposed in the peripheral area NAA of the first non-bending area NBA1, and in this case, the dam patterns DMP1 and DMP2 may be formed through the same process as the pixel definition layer PDL and may include the same material as the pixel definition layer PDL.

FIG. 6A shows a structure in which each of the dam patterns DMP1 and DMP2 has a single-layer structure as a representative example, however, the present disclosure should not be limited thereto or thereby. According to an embodiment, each of the dam patterns DMP1 and DMP2 may be formed through the same process as at least two of the fifth insulating layer the sixth insulating layer 60, and the pixel definition layer PDL and thus may have a multi-layer structure.

Each of the dam patterns DMP1, DMP2 may have a trapezoidal shape when viewed in a cross-sectional view. The dam patterns DMP1 and DMP2 may include a lower surface that is in contact with the fifth insulating layer 50, an upper surface opposite to the lower surface, and a side surface connecting the lower surface and the upper surface and inclined with respect to the lower surface and the upper surface.

The insulating pattern ISP may extend from the peripheral area NAA of the first non-bending area NBA1 to the second non-bending area NBA2. The insulating pattern ISP may be entirely disposed in the bending area BA. The insulating pattern ISP may be spaced apart from the sixth insulating layer 60 with the dam patterns DMP1 and DMP2 interposed therebetween in the first direction DR1.

The insulating pattern ISP may be formed through the same process as the sixth insulating layer 60. That is, the insulating pattern ISP may be disposed on the fifth insulating layer 50 and may include the same material as that of the sixth insulating layer 60.

However, the present disclosure should not be limited thereto or thereby. According to an embodiment, similarly to the sixth insulating layer 60 shown in FIGS. 6A and 6B, the fifth insulating layer 50 may be disposed only in the first non-bending area NBA1, and in this case, the insulating pattern ISP may be formed through the same process as the fifth insulating layer 50. According to an embodiment, the sixth insulating layer 60 may be entirely disposed in the peripheral area DP-NAA of the first non-bending area NBA1, and in this case, the insulating pattern ISP may be formed through the same process as the pixel definition layer PDL.

FIG. 6A shows the insulating pattern ISP with a single-layer structure as a representative example, however, the present disclosure should not be limited thereto or thereby. According to an embodiment, the insulating pattern ISP may be formed through the same process as at least two of the fifth insulating layer 50, the sixth insulating layer 60, and the pixel definition layer PDL and thus may have a multi-layer structure.

The first and second encapsulation inorganic layers IOL1 and IOL2 may overlap the entire dam patterns DMP1 and DMP2 and a portion of the insulating pattern ISP. The first and second encapsulation inorganic layers IOL1 and IOL2 may not be disposed in the bending area BA and the second non-bending area NBA2.

The first sensing insulating layer TIL1 may overlap the first and second non-bending areas NBA1 and NBA2 and may not overlap the bending area BA. A portion of the first sensing insulating layer TILL which overlaps the peripheral area NAA of the first non-bending area NBA1, may overlap the dam patterns DMP1 and DMP2 and may overlap a portion of the insulating pattern ISP. According to an embodiment, the first sensing insulating layer TIL1 may cover ends of the first and second encapsulation inorganic layers IOL1 and IOL2 disposed on the insulating pattern ISP.

The second sensing insulating layer TIL2 may overlap the first and second non-bending areas NBA1 and NBA2 and the bending area BA. The second sensing insulating layer TIL2 may overlap the dam patterns DMP1 and DMP2 and the insulating pattern ISP. The second sensing insulating layer TIL2 may be in contact with the insulating pattern ISP in an area where the first sensing insulating layer TIL1 is not disposed. However, the present disclosure should not be limited thereto or thereby, and the second sensing insulating layer TIL2 may not overlap the bending area BA.

According to an embodiment, the sensing pads ISL-PD1 and ISL-PD2 (refer to FIG. 4B) may be disposed on the fourth insulating layer 40, however, the present disclosure should not be limited thereto or thereby. According to an embodiment, the sensing pads ISL-PD1 and ISL-PD2 (refer to FIG. 4B) may be disposed on one of the first to third insulating layers 10 to 30. The display pads DP-PD described with reference to FIG. 3A may be disposed on the same layer as the sensing pads ISL-PD1 and ISL-PD2 (refer to FIG. 4B).

An end of each of the sensing pads ISL-PD1 and ISL-PD2 (refer to FIG. 4B) may be exposed without being covered by the fifth insulating layer 50, the insulating pattern ISP, and the second sensing insulating layer TIL2. The flexible circuit board CF (refer to FIG. 2) may be attached to the end of the exposed sensing pad, and the input sensor ISL may be electrically connected to the main circuit board MB (refer to FIG. 2).

Referring to FIGS. 5, 6A, and 6B, the first group lines TL-1 may include first and second trace lines TL1 and TL2. In the present embodiment, each of the first and second trace lines TL1 and TL2 may be provided in plural, and the first and second trace lines TL1 and TL2 may be alternately arranged with each other.

The first trace line TL1 may include a first line portion L1, a second line portion L2, and a first bridge B1.

In FIG. 5, the first line portion L1 and the first bridge B1 are indicated by a solid line and may be included in the upper portion described with reference to FIG. 4B. FIG. 5 is an enlarged plan view showing a portion of the upper portion which extends in the first direction DR1 between the sensing electrodes TE1 and TE2 and the dam patterns DMP1 and DMP2. In FIG. 5, the second line portion L2 is indicated by a dotted line. The second line portion L2 may be included in the connection portion described with reference to FIG. 4B and may correspond to the bending line portion TL-B described with reference to FIG. 3A.

The first line portion L1 may overlap the first non-bending area NBA1. The first line portion L1 may be included in the first sensing conductive layer TML1 described with reference to FIG. 4A. That is, the first line portion L1 may be disposed on the first sensing insulating layer TIL1 and may be covered by the second sensing insulating layer TIL2.

The second line portion L2 may extend from the peripheral area NAA of the first non-bending area NBA1 to the second non-bending area NBA2 along the first direction DR1 and may entirely cross the bending area BA. The second line portion L2 may be disposed on the fifth insulating layer 50 (the first organic insulating layer) and may be covered by the sixth insulating layer 60 (the second organic insulating layer). The second line portion L2 may be disposed on the same layer as the second connection electrode CNE2 (refer to FIG. 3B) of the display panel DP.

The first bridge B1 may overlap the first non-bending area NBA1. The first bridge B1 may be connected to an end of the first line portion L1 which is disposed adjacent to the bending area BA and an end of the second line portion L2 which is disposed in the first non-bending area NBA1. The first bridge B1 may be included in the second sensing conductive layer TML2 described with reference to FIG. 4B. That is, the first bridge B1 may be disposed on the second sensing insulating layer TIL2.

The first bridge B1 may be connected to the first line portion L1 via a first contact hole CNT1. The first contact hole CNT1 may be defined through the second sensing insulating layer TIL2.

The first bridge B1 may be connected to the second line portion L2 via a second contact hole CNT2. The second contact hole CNT2 shown in FIG. 5 may correspond to the first input contact hole CNT-I1 shown in FIGS. 3A and 4B. The second contact hole CNT2 may be defined through the first and second sensing insulating layers TIL1 and TIL2 and the sixth insulating layer 60. According to an embodiment, the first sensing insulating layer TIL1 may not be disposed in area where the second contact hole CNT2 is defined, and in this case, the second contact hole CNT2 may be defined through only the second sensing insulating layer TIL2 and the sixth insulating layer 60.

The second trace line TL2 may include a third line portion L3, a fourth line portion L4, and a second bridge B2.

In FIG. 5, the third line portion L3 and the second bridge B2 are indicated by a solid line and may be included in the upper portion described with reference to FIG. 4B. In FIG. 5, the fourth line portion L4 is indicated by a dotted line and may be included in the connection portion described with reference to FIG. 4B. In addition, the fourth line portion L4 may correspond to the bending line portion TL-B described with reference to FIG. 3A.

The third line portion L3 may overlap the first non-bending area NBA1. The third line portion L3 may be included in the first sensing conductive layer TML1 described with reference to FIG. 4A. That is, the third line portion L3 may be disposed on the first sensing insulating layer TIL1 and may be covered by the second sensing insulating layer TIL2.

The fourth line portion L4 may extend from the first non-bending area NBA1 to the second non-bending area NBA2 along the first direction DR1 and may entirely cross the bending area BA. The fourth line portion L4 may be disposed on the fifth insulating layer 50 (the first organic insulating layer) and may be covered by the sixth insulating layer 60 (the second organic insulating layer). The fourth line portion L4 may be disposed on the same layer as the second connection electrode CNE2 (refer to FIG. 3B) of the display panel DP.

The second bridge B2 may overlap the first non-bending area NBA1. The second bridge B2 may be connected to an end of the third line portion L3 which is disposed adjacent to the bending area BA, and an end of the fourth line portion L4 which is disposed in the first non-bending area NBA1. The second bridge B2 may be included in the second sensing conductive layer TML2 described with reference to FIG. 4A. That is, the second bridge B2 may be disposed on the second sensing insulating layer TIL2.

The second bridge B2 may be connected to the third line portion L3 via the first contact hole CNT1 defined through the second sensing insulating layer TIL2. The second bridge B2 may be connected to the fourth line portion L4 via the second contact hole CNT2 defined through the first and second sensing insulating layers TIL1 and TIL2 and the sixth insulating layer 60.

FIG. 5 shows two first contact holes CNT1 each through which one first line portion L1 is connected to the first bridge B1 and two first contact holes CNT1 each through which one second line portion L3 is connected to the second bridge B2. However, the number of the first contact holes CNT1 should not be limited thereto or thereby.

Each of the first and third line portions L1 and L3 may include compensation areas CA and normal areas NA. The compensation areas CA may respectively overlap the dam patterns DMP1 and DMP2 when viewed in a plane, and the normal areas NA may correspond to the other areas except for the compensation areas CA.

In a process of forming the first and third line portions L1 and L3, a material initially provided for each of the first and third line portions L1 and L3, for example, a deposition material provided by a deposition process, may flow down sides of the inclined dam patterns DMP1 and DMP2 in the compensation areas CA and may be thinly deposited compared to that of the normal areas NA. According to the present embodiment, a width in the second direction DR2 of each of the compensation areas CA when viewed in a plane may be greater than a width in the second direction DR2 of each of the normal areas NA, and thus, a difference in mutual capacitance between the compensation areas CA and the normal areas NA may be reduced. As a result, the sensing reliability may be improved.

According to the present disclosure, the first and second line portions L1 and L2 may be electrically connected to each other by the first bridge B1, and the third and fourth line portions L3 and L4 may be electrically connected to each other by the second bridge B2. In a case where the first line portion L1 is directly connected to the second line portion L2 and the third line portion L3 is directly connected to the fourth line portion L4, a separate mask is required to form a contact hole through the first sensing insulating layer TIL1.

According to the present disclosure, the first contact holes CNT1 through which the first and second bridges B1 and B2 are respectively connected to the first and third line portions L1 and L3, and the second contact holes CNT2 through which the first and second bridges B1 and B2 are respectively connected to the second and fourth line portions L2 and L4 may be formed using the same mask as a mask used to form the contact holes through which the first sensing patterns SP1 (refer to FIG. 4B) are connected to the first conductive patterns BP1 (refer to FIG. 4B) in the active area IS-AA (refer to FIG. 4B). Accordingly, an additional mask for the electrical connection between the first and second line portions L1 and L2 and the third and fourth line portions L3 and L4 may be no longer required. Accordingly, the manufacturing process of the display module DM may be simplified, and thus, the cost of the display device DD (refer to FIG. 1) may be reduced.

When viewed in the plane, a width in the second direction DR2 of the first bridge B1 may be greater than a width in the second direction DR2 of each of the first and second line portions L1 and L2. A width in the second direction DR2 of the second bridge B2 may be greater than a width in the second direction DR2 of each of the third and fourth line portions L3 and L4. Accordingly, even though errors occur in the arrangement of the first, second, third, and fourth line portions L1, L2, L3, and L4 or in the arrangement of the first and second bridges B1 and B2, contact failure may not occur.

According to an embodiment, each of the first and second bridges B1 and B2 may extend in the first direction DR1. Each of the first and second bridges B1 and B2 may have a rectangular shape defined by long sides extending in the first direction DR1 and short sides extending in the second direction DR2, however, it should not be limited thereto or thereby. According to an embodiment, the shape of the first and second bridges B1 and B2 should not be particularly limited as long as the first and second bridges B1 and B2 have the shape appropriate to electrically connect the first and second line portions L1 and L2 to each other and the third and fourth line portions L3 and L4 to each other.

According to the present embodiment, when viewed in the second direction DR2, the first and second bridges B1 and B2 may not overlap each other. When viewed in the plane, a distance d1-1 between the first bridge B1 and the bending area BA may be greater than a distance d2-1 between the second bridge B2 and the bending area BA.

As the second sensing conductive layer TML2 (refer to FIG. 4A) is disposed at the uppermost position, metal particles, for example, TiO₂ residual layers, may be remained on the second sensing insulating layer TIL2 due to moisture remained in the second sensing insulating layer TIL2 in the process of forming the second sensing conductive layer TML2 (refer to FIG. 4A), or metal particles provided in other processes may remain in the second sensing insulating layer TIL2. In the case where the first and second bridges B1 and B2 are aligned in the second direction DR2, the metal particle, for example, the TiO₂ residual layers, formed between the first and second bridges B1 and B2 may cause a short-circuit between the first and second bridges B1 and B2.

According to the present disclosure, as the first and second bridges B1 and B2 are spaced apart from each other in the first direction and the second direction, and the first and second bridges B1 and B2 are spaced apart from the bending area BA at different separation distances, the short-circuit may be prevented from occurring between the first and second bridges B1 and B2 even though the metal particles, for example, the TiO₂ residual layers, are formed. Accordingly, the sensing reliability of the display device DD (refer to FIG. 1) may be improved.

According to a comparative embodiment, the first and second bridges may be aligned in a line along the second direction DR2, the separation distance in the second direction DR2 between the first and second bridges may be equal to or greater than about 1 micrometers and equal to or smaller than about 20 micrometers. According to the present embodiment, the separation distance in the second direction DR2 between the first and second bridges B1 and B2 may be equal to or greater than about 5 micrometers and equal to or smaller than about 100 micrometers. As an example, the separation distance in the second direction DR2 between the first and second bridges B1 and B2 according to the present embodiment may be five times greater than the separation distance in the second direction DR2 between the first and second bridges.

The first trace line TL1 may include a fifth line portion L5, a third bridge B3, and a fifth bridge B5 which overlap the second non-bending area NBA2, and the second trace line TL2 may include a sixth line portion L6, a fourth bridge B4, and a sixth bridge B6 which overlap the second non-bending area NBA2. The fifth and sixth line portions L5 and L6 and the third to sixth bridges B3 to B6 may be included in the lower portion described with reference to FIG. 4B.

The fifth line portion L5 may be electrically connected to the second line portion L2, and the sixth line portion L6 may be electrically connected to the fourth line portion L4. Each of the fifth and sixth line portions L5 and L6 may be electrically connected to a corresponding sensing pad among the sensing pads ISL-PD1.

The fifth line portion L5 of the first trace line TL1 may be electrically connected to the second line portion L2 and a corresponding sensing pad ISL-PD1 among the sensing pads ISL-PD1. The fifth line portion L5 may be included in the first sensing conductive layer TML1 described with reference to FIG. 4A. That is, the fifth line portion L5 may be disposed on the first sensing insulating layer TILL According to an embodiment, the fifth line portion L5 may include first, second, and third portions P1, P2, and P3.

One end of the first portion P1 may correspond to one end of the fifth line portion L5 disposed adjacent to the second line portion L2. The first portion P1 may extend in the first direction DR1. One end of the second portion P2 may correspond to the other end of the fifth line portion L5 disposed adjacent to the corresponding sensing pad ISL-PD1. The second portion P2 may extend in the first direction DR1.

The third portion P3 may be disposed between the first and second portions P1 and P2. The third portion P3 may extend from the other end of the first portion P1 to the other end of the second portion P2. According to an embodiment, the third portion P3 may extend in the oblique direction with respect to the first direction DR1.

The sixth line portion L6 of the second trace line TL2 may be electrically connected to the fourth line portion L4 and a corresponding sensing pad ISL-PD1 among the sensing pads ISL-PD1. The sixth line portion L6 may be included in the first sensing conductive layer TML1 described with reference to FIG. 4A. That is, the sixth line portion L6 may be disposed on the first sensing insulating layer TILL According to an embodiment, the sixth line portion L6 may include fourth, fifth, and sixth portions P4, P5, and P6.

One end of the fourth portion P4 may correspond to one end of the sixth line portion L6 disposed adjacent to the fourth line portion L4. The fourth portion P4 may extend in the first direction DR1. One end of the fifth portion P5 may correspond to the other end of the sixth line portion L6 disposed adjacent to the corresponding sensing pad ISL-PD1. The fifth portion P5 may extend in the first direction DR1.

The sixth portion P6 may be disposed between the fourth and fifth portions P4 and P5. The sixth portion P6 may extend from the other end of the fourth portion P4 to the other end of the fifth portion P5. According to an embodiment, the sixth portion P6 may extend in the oblique direction with respect to the first direction DR1.

In the present embodiment, a minimum separation distance d2-2 between the second and fifth portions P2 and P5 may be greater than a minimum separation distance d1-2 between the first and fourth portions P1 and P4 and a minimum separation distance d3-2 between the third and sixth portions P3 and P6. As the display module DM includes the third and sixth portions P3 and P6 extending in the oblique direction, the minimum separation distance between the second and fifth portions P2 and P5 connected to the sensing pads ISL-PD1 may increase.

As the minimum separation distance d2-2 increases only in the second and fifth portions P2 and P5, which are disposed adjacent to the sensing pads ISL-PD1, of the lower portion, the area in which the trace lines TL are disposed may be reduced in the other portions of the lower portion except the second and fifth portions P2 and P5, the upper portion, and the connection portion. Accordingly, an interference with other components may be reduced, and thus, freedom of design and manufacture of other components may increase.

The third bridge B3 of the first trace line TL1 may be connected to the other end of the second line portion L2 and one end of the fifth line portion L5, i.e., the one end of the first portion P1, in the second non-bending area NBA2. The third bridge B3 may be included in the second sensing conductive layer TML2 described with reference to FIG. 4A. That is, the third bridge B3 may be disposed on the second sensing insulating layer TIL2.

The third bridge B3 may be connected to the second line portion L2 via a third contact hole CNT3. The third contact hole CNT3 may be defined through the first and second sensing insulating layers TIL1 and TIL2 and the sixth insulating layer 60.

The third bridge B3 may be connected to the fifth line portion L5 via a fourth contact hole CNT4. The fourth contact hole CNT4 may be defined through the second sensing insulating layer TIL2. However, according to an embodiment, the first sensing insulating layer TIL1 may not be disposed in the area in which the third contact hole CNT3 is defined, and in this case, the third contact hole CNT3 may be defined only through the second sensing insulating layer TIL2 and the sixth insulating layer 60.

The fourth bridge B4 of the second trace line TL2 may be connected to the other end of the fourth line portion L4 and one end of the sixth line portion L6, i.e., the one end of the fourth portion P4, which are disposed in the second non-bending area NBA2. The fourth bridge B4 may be included in the second sensing conductive layer TML2 described with reference to FIG. 4A. That is, the fourth bridge B4 may be disposed on the second sensing insulating layer TIL2.

The fourth bridge B4 may be connected to the fourth line portion L4 via the third contact hole CNT3 defined through the first and second sensing insulating layers TIL1 and TIL2 and the sixth insulating layer 60. The fourth bridge B4 may be connected to the sixth line portion L6 via the fourth contact hole CNT4 defined through the second sensing insulating layer TIL2.

According to the present embodiment, as the display module DM includes the third bridge B3 that electrically connects the second and fifth line portions L2 and L5, an additional mask used to form a contact hole through which the second and fifth line portions L2 and L5 are directly connected to each other may be no longer required. In addition, as the display module includes the fourth bridge B4 that electrically connects the fourth and sixth line portions L4 and L6, an additional mask used to form a contact hole through which the fourth and sixth line portions L4 and L6 are directly connected to each other may be no longer required. Accordingly, the manufacturing process of the display module DM may be simplified, and thus, the cost of the display device DD (refer to FIG. 1) may be reduced.

According to the present disclosure, when viewed in the second direction DR2, the third and fourth bridges B3 and B4 may not overlap each other. Accordingly, since the separation distance between the third and fourth bridges B3 and B4 increases, the short-circuit may be prevented from occurring between the third and fourth bridges B3 and B4 even though metal particles, for example, the $TiO_2$ residual layers, are formed on the second sensing insulating layer TIL2. Accordingly, the sensing reliability of the display device DD (refer to FIG. 1) may be improved.

According to the present embodiment, when viewed in the plane, a distance d3-1 between the third bridge B3 and the bending area BA may be greater than a distance d4-1 between the fourth bridge B4 and the bending area BA. That is, the separation distance between the first and third bridges B1 and B3 may be greater than the separation distance between the second and fourth bridges B2 and B4. Accordingly, a length in the first direction DR1 of the second line portion L2 may be longer than a length in the first direction DR1 of the fourth line portion L4.

The fifth bridge B5 of the first trace line TL1 may be connected to the other end of the fifth line portion L5 and a corresponding sensing pad ISL-PD1. The fifth bridge B5 may be included in the second sensing conductive layer TML2 described with reference to FIG. 4A. That is, the fifth bridge B5 may be disposed on the second sensing insulating layer TIL2.

The fifth bridge B5 may be connected to the fifth line portion L5 via a fifth contact hole CNT5. The fifth contact hole CNT5 may be defined through the second sensing insulating layer TIL2.

The fifth bridge B5 may be connected to the corresponding sensing pads ISL-PD1 via a sixth contact hole CNT6. The sixth contact hole CNT6 may be defined through the first and second sensing insulating layers TIL1 and TIL2 and the fifth and sixth insulating layers 50 and (ISP). However, according to an embodiment, the first sensing insulating layer TIL1 may not be disposed in an area where the sixth contact hole CNT6 is defined, and in this case, the sixth contact hole CNT6 may be defined through the second sensing insulating layer TIL2 and the sixth insulating layer 60.

The sixth bridge B6 of the second trace line TL2 may be connected to the other end of the sixth line portion L6 and a corresponding sensing pad ISL-PD1. The sixth bridge B6 may be included in the second sensing conductive layer TML2 described with reference to FIG. 4A. That is, the sixth bridge B6 may be disposed on the second sensing insulating layer TIL2.

The sixth bridge B6 may be connected to the sixth line portion L6 via the fifth contact hole CNT5 defined through the first sensing insulating layer TIL1. The sixth bridge B6 may be connected to the corresponding sensing pad ISL-PD1 via the sixth contact hole CNT6 defined through the first and second sensing insulating layers TILL and TIL2 and the fifth and sixth insulating layers 50 and 60.

According to the present disclosure, as the display module DM includes the fifth bridge B5 that electrically connects the fifth line portion L5 and the corresponding sensing pad ISL-PD1, an additional mask used to form a contact hole through which the fifth line portion L5 and the sensing pad ISL-PD1 are directly connected to each other may be no longer required. In addition, as the display module DM includes the sixth bridge B6 that electrically connects the sixth line portion L6 and the corresponding sensing pattern ISL-PD1, an additional mask used to form a contact hole through which the sixth line portion L6 and the corresponding sensing pad ISL-PD1 are directly connected to each other may be no longer required. Accordingly, the manufacturing process of the display module DM may be simplified, and thus, the cost of the display device DD (refer to FIG. 1) may be reduced.

According to an embodiment, the fifth and sixth bridges B5 and B6 may be arranged in the second direction DR2. As the separation distance between the second portion P2 of the fifth line portion L5 and the fifth portion P5 of the sixth line portion L6 increases, the separation distance between the fifth and sixth bridges B5 and B6 may also increase. Accordingly, although the fifth and sixth bridges B5 and B6 overlap each other in the second direction, the short-circuit due to the metal particles, for example, the $TiO_2$ residual layers, may not be generated, however, they should not be limited thereto or thereby. According to an embodiment, similar to the first, second, third, and fourth bridges B1, B2, B3, and B4, the fifth and sixth bridges B5 and B6 may be disposed not to overlap each other when viewed in the second direction DR2.

According to an embodiment, the fifth line portion L5 and the third bridge B3 of the first trace line TL1 may be omitted, and the sixth line portion L6 and the fourth bridge B4 of the second trace line TL2 may be omitted. In this case, the second line portion L2 may extend to the second non-bending area NBA2 and may be connected to the corresponding sensing pad ISL-PD1, and the fourth line portion L4 may extend to the second non-bending area NBA2 and may be connected to the sensing pad ISL-PD1.

Figure 7:
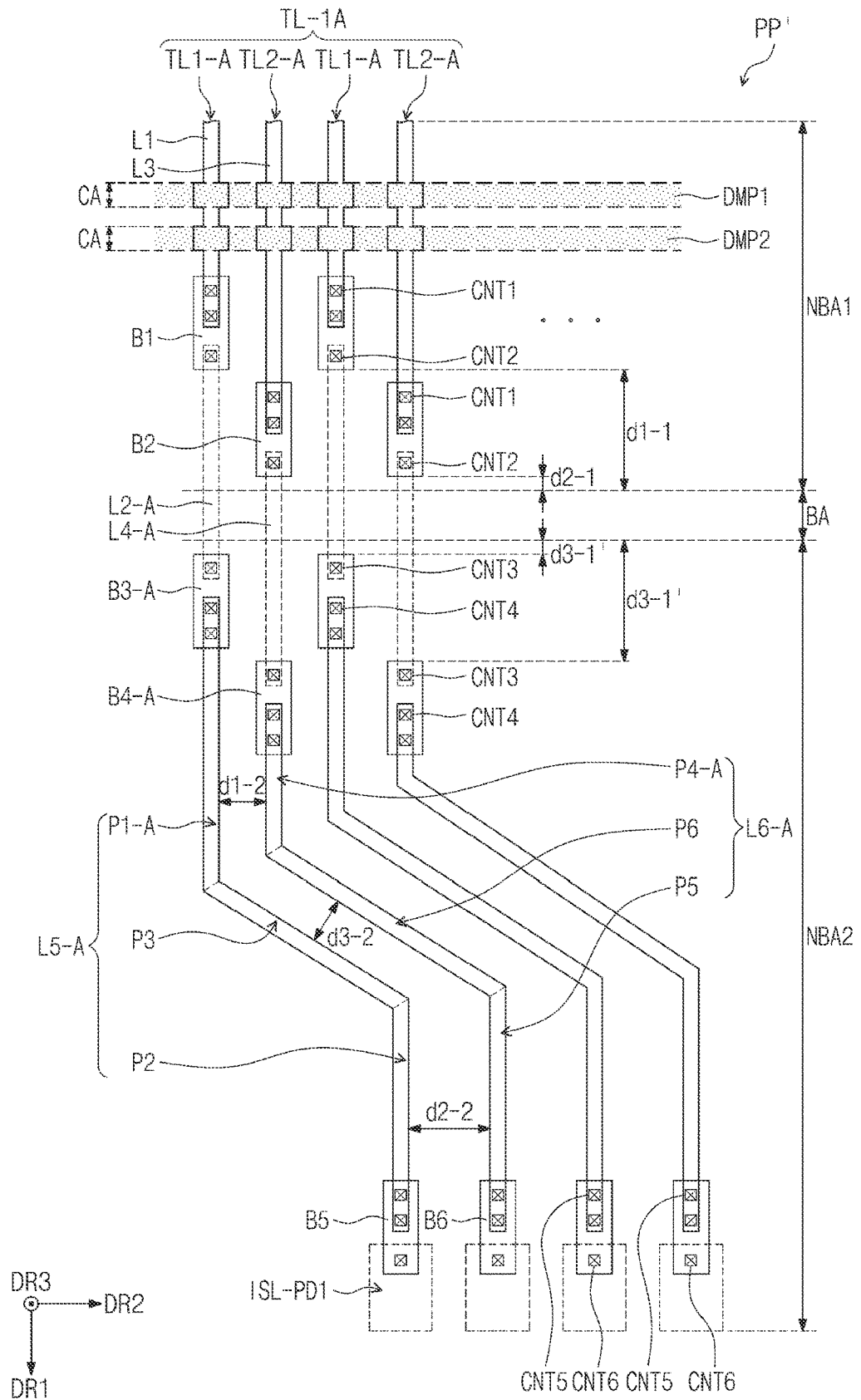
FIG. 7 is an enlarged plan view of an area PP' of FIG. 4B of a display module according to an embodiment of the present disclosure.

FIG. 7 is an enlarged plan view of an area PP' of FIG. 4B of a display module according to an embodiment of the present disclosure. FIG. 7 shows only a first group lines TL-1A as a representative example, and descriptions on the first group lines TL-1A may be equally/similarly applied to the second, third, and fourth group lines TL-2, TL-3, and TL-4 (refer to FIG. 4B). In FIGS. 1 to 6B, the same/similar reference numerals denote the same/similar elements in FIGS. 1 to 6B, and thus, detailed descriptions of the same/similar elements will be omitted.

The first group lines TL-1A may include a first trace line TL1-A and a second trace line TL2-A. The first trace line TL1-A may include first, second, and fifth line portions L1, L2-A, and L5-A and first, third, and fifth bridges B1, B3-A, and B5. The second trace line TL2 may include third, fourth, and sixth line portions L3, L4-A, and L6-A and second, fourth, and sixth bridges B2, B4-A, and B6.

The first and third line portions L1 and L3 and the first and second bridges B1 and B2 may overlap the first non-bending area NBA1, the second and fourth line portions L2-A and L4-A may be disposed in the bending area BA, and the fifth and sixth line portions L5-A and L6-A and the third, fourth, fifth, and sixth bridges B3-A, B4-A, B5, and B6 may overlap the second non-bending area NBA2.

When viewed in the second direction DR2, the first and second bridges B1 and B2 may not overlap each other. In addition, when viewed in the second direction DR2, the third and fourth bridges B3-A and B4-A may not overlap each other.

According to the present embodiment, when viewed in the plane, a distance d1-1 between the first bridge B1 and the bending area BA may be greater than a distance d2-1 between the second bridge B2 and the bending area BA. When viewed in the plane, a distance d3-1' between the third bridge B3-A and the bending area BA may be smaller than a distance d4-1' between the fourth bridge B4-A and the bending area BA.

According to an embodiment, the separation distance between the first and third bridges B1 and B3-A may be substantially the same as the separation distance between the second and fourth bridges B2 and B4-A. That is, a length in the first direction DR1 of the second line portion L2-A may be substantially the same as a length in the first direction DR1 of the fourth line portion L4-A.

The fifth line portion L5-A of the first trace line TL1-A may include first, second, and third portions P1-A, P2, and P3, and the sixth line portion L6 of the second trace line TL2-A may include fourth, fifth, and sixth portions P4-A, P5, and P6. According to the present embodiment, in the first and second trace lines TL1-A and TL2-A disposed adjacent to each other, a length in the first direction DR1 of the first portion P1-A may be greater than a length in the first direction DR1 of the fourth portion P4-A.

Figure 8:
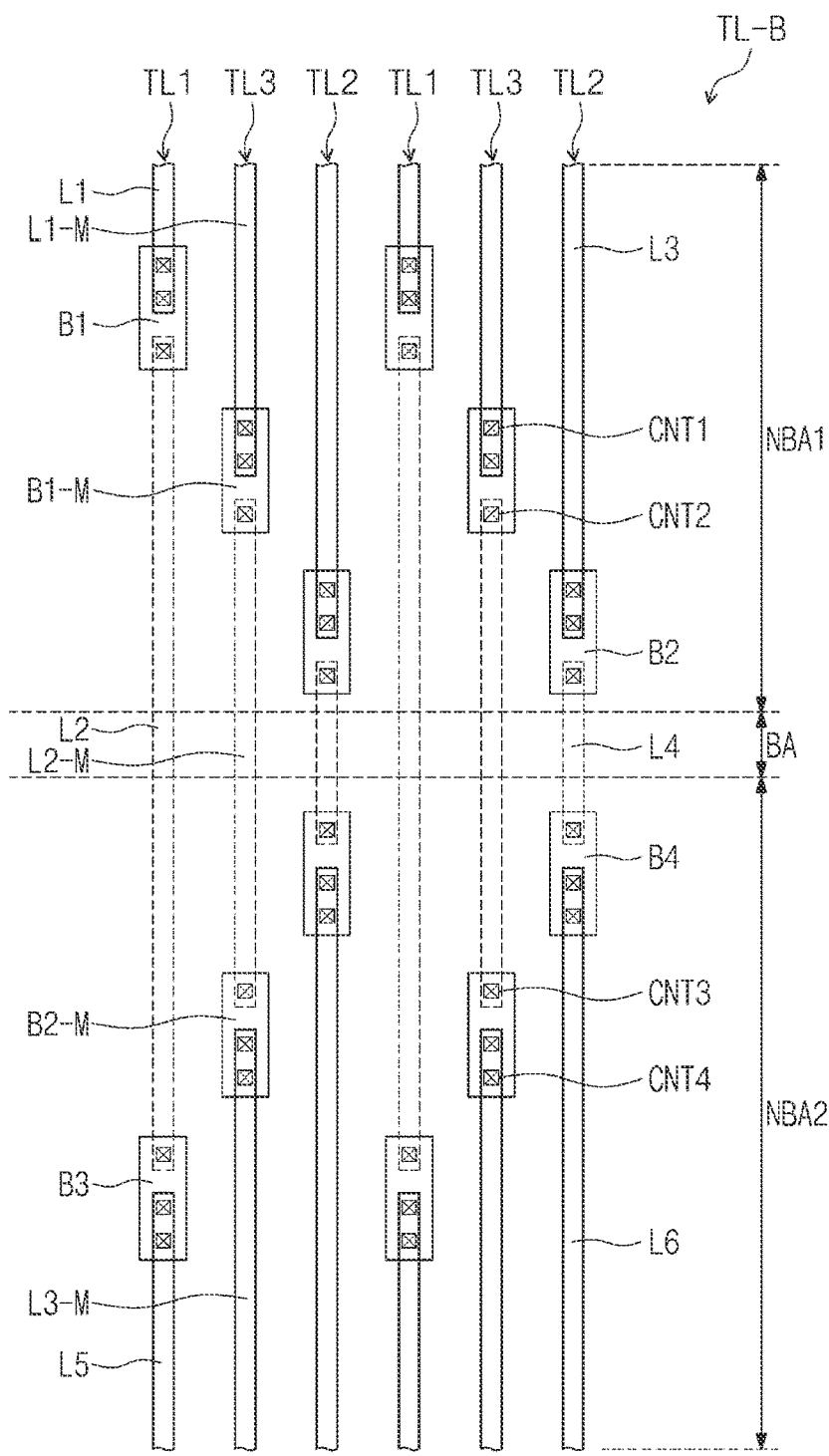
FIG. 8 is an enlarged plan view of a portion of a display module according to an embodiment of the present disclosure.
Figure 8:
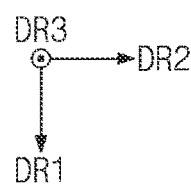

FIG. 8 is an enlarged plan view of a portion of a display module according to an embodiment of the present disclosure. In FIG. 8, the same/similar reference numerals denote the same/similar elements in FIGS. 1 to 7, and thus, detailed descriptions of the same/similar elements will be omitted.

In the present embodiment, the trace lines TL-B may include first, second, and third trace lines TL1, TL2, and TL3. The third trace line TL3 may be disposed between the first and second trace lines TL1 and TL2. The trace lines TL-B may be arranged repeatedly in the order of first, third, and second trace lines TL1, TL3, and TL2.

The first trace line TL1 may include first, second, and fifth line portions L1, L2, and L5 and first, third, and fifth bridges B1, B3, and B5 (refer to FIG. 5). The second trace line TL2 may include third, fourth, and sixth line portions L3, L4, and L6 and second, fourth, and sixth bridges B2, B4, and B6 (refer to FIG. 5). The descriptions on the first to sixth line portions L1 to L6 and the first to sixth bridge B1 to B6 with reference to FIG. 5 may be applied to the portion of the display module shown in FIG. 8.

The third trace line TL3 may include first, second, and third additional line portions L1-M, L2-M, and L3-M and the first and second additional bridges B1-M and B2-M. The first additional line portion L1-M and the first additional bridge B1-M may overlap the first non-bending area NBA1 and may be included in the upper portion described with reference to FIG. 4B, the second additional line portion L2-M may be disposed in the bending area BA and may be included in the connection portion described with reference to FIG. 4B, and the third additional line portion L3-M and the second additional bridge B2-M may overlap the second non-bending area NBA2 and may be included in the lower portion described with reference to FIG. 4B.

The first additional line portion L1-M may be included in the first sensing conductive layer TML1 described with reference to FIG. 4A and may be disposed on the first sensing insulating layer TIL1. The second additional line portion L2-M may be disposed on the fifth insulating layer 50 (refer to FIG. 6B) of the display panel DP (refer to FIG. 6B) and may be disposed on the same layer as the second connection electrode CNE2 (refer to FIG. 3B).

The first additional bridge B1-M may be connected to one end of the first additional line portion L1-M disposed adjacent to the bending area BA and one end of the second additional line portion L2-M disposed in the first non-bending area NBA1. The first additional bridge B1-M may be included in the second sensing conductive layer TML2 described with reference to FIG. 4A and may be disposed on the second sensing insulating layer TIL2.

The first additional bridge B1-M may be connected to the first additional line portion L1-M via a first contact hole CNT1 defined through a first sensing insulating layer TIL1 (refer to FIG. 6A). The first additional bridge B1-M may be connected to the second additional line portion L2-M via a second contact hole CNT2 defined through the first and second sensing insulating layers TIL1 and TIL2 (refer to FIG. 6A) and the sixth insulating layer 60 (refer to FIG. 6A).

In the present embodiment, when viewed in the second direction DR2, the first additional bridge B1-M may not overlap the first and second bridges B1 and B2. That is, when viewed in the plane, a separation distance between the first additional bridge B1-M and the bending area BA may be different from a separation distance between the first bridge B1 and the bending area BA and a separation distance between the second bridge B2 and the bending area BA.

As an example, the separation distance between the first additional bridge B1-M and the bending area BA may be greater than the separation distance between the second bridge B2 and the bending area BA and may be smaller than the separation distance between the first bridge B1 and the bending area BA.

The third additional line portion L3-M may be electrically connected to the second additional line portion L2-M and a corresponding sensing pad among the sensing pads ISL-PD1 and ISL-PD2 (refer to FIG. 4B). FIG. 8 shows only one end of the third additional line portion L3-M which is disposed adjacent to the second additional line portion L2-M, however, the other end of the third additional line portion L3-M may be disposed adjacent to the corresponding sensing pad.

The third additional line portion L3-M may be included in the first sensing conductive layer TML1 described with reference to FIG. 4A and may be disposed on the first sensing insulating layer TIL1.

The second additional bridge B2-M may be connected to the other end of the second additional line portion L2-M and one end of the third additional line portion L3-M, which are disposed in the second non-bending area NBA2. The second additional bridge B2-M may be included in the second sensing conductive layer TML2 described with reference to FIG. 4A and may be disposed on the second sensing insulating layer TIL2 (refer to FIG. 6B).

The second additional bridge B2-M may be connected to the second additional line portion L2-M via a third contact hole CNT3 defined through the first and second sensing insulating layers TIL1 and TIL2 and the sixth insulating layer 60 (refer to FIG. 6B). The second additional bridge B2-M may be connected to the third additional line portion L3-M via a fourth contact hole CNT4 defined through the second sensing insulating layer TIL2 (refer to FIG. 6B).

The third trace line TL3 may further include an additional bridge connected to the other end of the third additional line portion L3-M, and the additional bridge may be included in the second sensing conductive layer TML2 described with reference to FIG. 4A and may be disposed on the second sensing insulating layer TIL2.

The additional bridge may be connected to the third additional line portion L3-M via a fifth contact hole CNT5 (refer to FIG. 6B) defined through the second sensing insulating layer TIL2 (refer to FIG. 6B) and may be connected to a corresponding sensing pad via a sixth contact hole CNT6 (refer to FIG. 6B) defined through the first and second sensing insulating layers TIL1 and TIL2 (refer to FIG. 6B) and the fifth and sixth insulating layers 50 and 60 (refer to FIG. 6B).

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:
1. A display device comprising:
a display panel comprising a first non-bending area comprising pixels, a bending area bent with respect to an imaginary axis, and a second non-bending area spaced apart from the first non-bending area with the bending area interposed therebetween in a first direction; and
an input sensor disposed on the display panel and comprising sensing electrodes overlapping the first non-bending area, a first trace line connected to a corresponding sensing electrode among the sensing electrodes, and a second trace line connected to a corresponding sensing electrode among the sensing electrodes,
wherein the first trace line comprises:
a first line portion overlapping the first non-bending area;
a second line portion crossing the bending area and disposed on a layer different from the first line portion; and
a first bridge overlapping the first non-bending area, connecting the first line portion to the second line portion, and disposed on a layer different from the first line portion and the second line portion,
wherein the second trace line comprises:
a third line portion overlapping the first non-bending area;
a fourth line portion crossing the bending area and disposed on a layer different from the third line portion; and
a second bridge overlapping the first non-bending area, connecting the third line portion to the fourth line portion, and disposed on a layer different from the third line portion and the fourth line portion,
wherein the first bridge and the second bridge do not overlap each other when viewed in a second direction perpendicular to the first direction, and
wherein the first bridge is a highest layer of the first trace line, and the second bridge is a highest layer of the second trace line.

2. A display device comprising:
a display panel comprising a first non-bending area comprising pixels, a bending area bent with respect to an imaginary axis, and a second non-bending area spaced apart from the first non-bending area with the bending area interposed therebetween in a first direction; and
an input sensor disposed on the display panel and comprising sensing electrodes overlapping the first non-bending area, a first trace line connected to a corresponding sensing electrode among the sensing electrodes, and a second trace line connected to a corresponding sensing electrode among the sensing electrodes,
wherein the first trace line comprises:
a first line portion overlapping the first non-bending area;
a second line portion crossing the bending area and disposed on a layer different from the first line portion; and
a first bridge overlapping the first non-bending area, connecting the first line portion to the second line portion, and disposed on a layer different from the first line portion and the second line portion, and
wherein the second trace line comprises:
a third line portion overlapping the first non-bending area;
a fourth line portion crossing the bending area and disposed on a layer different from the third line portion; and
a second bridge overlapping the first non-bending area, connecting the third line portion to the fourth line portion, and disposed on a layer different from the third line portion and the fourth line portion,
wherein the first bridge and the second bridge do not overlap each other when viewed in a second direction perpendicular to the first direction,
wherein the input sensor comprises:
a first sensing insulating layer disposed on the display panel; and;
a second sensing insulating layer disposed on the first sensing insulating layer, wherein the first line portion and the third line portion are disposed on the first sensing insulating layer, and
wherein the first bridge and the second bridge are disposed on the second sensing insulating layer.

3. The display device of claim 2, wherein the first sensing insulating layer comprises an inorganic material and the second sensing insulating layer comprises an organic material.

4. The display device of claim 2, wherein the sensing electrodes comprise:
a first sensing electrode comprising first sensing patterns disposed on the first sensing insulating layer and a connection pattern disposed on the second sensing insulating layer and connected to the first sensing patterns disposed adjacent each other via a contact hole defined through the second sensing insulating layer; and
a second sensing electrode insulated from the first sensing electrode and disposed on the first sensing insulating layer.

5. The display device of claim 1, wherein each of the pixels comprises:
a transistor; and
a light emitting element connected to the transistor,
wherein the display panel further comprises:
a first organic insulating layer disposed on the transistor; and
a second organic insulating layer disposed on the first organic insulating layer,
wherein the second line portion and the fourth line portion are disposed on the first organic insulating layer, and
wherein the light emitting element is disposed on the second organic insulating layer.

6. The display device of claim 5, wherein the display panel further comprises at least one dam pattern that does not overlap the pixels and is disposed in the first non-bending area, and
wherein a width in the second direction of each of a portion of the first line portion and a portion of the third line portion overlapping the at least one dam pattern is greater than a width in the second direction each of the other portion of the first line portion and the other portion of the third line portion when viewed in a plane.

7. The display device of claim 5, wherein the display panel further comprises at least one dam pattern that does not overlap the pixels and is disposed in the first non-bending area, and
wherein a width in the second direction of each of a portion of the first line portion and a portion of the third line portion overlapping the at least one dam pattern is greater than a width in the second direction each of the other portion of the first line portion and the other portion of the third line portion when viewed in a plane.

8. The display device of claim 1, wherein the first trace line further comprises:
a fifth line portion overlapping the second non-bending area and disposed on a same layer as the first line portion; and
a third bridge overlapping the second non-bending area, disposed on a same layer as the first bridge, and connected to the second line portion and the fifth line portion,
wherein the second trace line further comprises:
a sixth line portion overlapping the second non-bending area and disposed on a same layer as the third line portion; and
a fourth bridge overlapping the second non-bending area, disposed on a same layer as the third bridge, and connected to the fourth line portion and the sixth line portion,
wherein the third bridge does not overlap the fourth bridge when viewed in the second direction.

9. The display device of claim 8, wherein a distance between the first bridge and the bending area is greater than a distance between the second bridge and the bending area when viewed in a plane, and
wherein a distance between the third bridge and the bending area is greater than a distance between the fourth bridge and the bending area when viewed in the plane.

10. The display device of claim 8, wherein a distance between the first bridge and the bending area is greater than a distance between the second bridge and the bending area when viewed in a plane, and
wherein a distance between the third bridge and the bending area is smaller than a distance between the fourth bridge and the bending area when viewed in the plane.

11. The display device of claim 8, wherein the display panel further comprises sensing pads overlapping the second non-bending area and electrically connected to the first trace line and the second trace line, respectively, and wherein the input sensor further comprises:
a fifth bridge overlapping the second non-bending area, disposed on a same layer as the third bridge, and connected to the fifth line portion and a corresponding sensing pad among the sensing pads; and
a sixth bridge overlapping the second non-bending area, disposed on a same layer as the fourth bridge, and connected to the sixth line portion and a corresponding sensing pad among the sensing pads.

12. The display device of claim 11, wherein the fifth line portion comprises:
a first portion connected to the third bridge and extending in the first direction;
a second portion connected to the fifth bridge and extending in the first direction; and
a third portion disposed between the first portion and the second portion, and extending in an oblique direction with respect to the first direction, and
wherein the sixth line portion comprises:
a fourth portion connected to the fourth bridge and extending in the first direction;
a fifth portion connected to the sixth bridge and extending in the first direction; and
a sixth portion disposed between the fourth portion and the fifth portion, and extending in the oblique direction with respect to the first direction.

13. The display device of claim 12, wherein a distance between the second portion and the fifth portion is greater than a distance between the first portion and the fourth portion and a distance between the third portion and the sixth portion.

14. The display device of claim 11, wherein the fifth bridge is spaced apart from the sixth bridge in the second direction.

15. The display device of claim 1, wherein each of the first trace line and the second trace line is provided in plural, and
wherein the first trace lines are alternately arranged with the second trace lines.

16. The display device of claim 1, wherein the input sensor further comprises a third trace line disposed between the first trace line and the second trace line,
wherein the third trace line comprises:
a first additional line portion overlapping the first non-bending area;
a second additional line portion crossing the bending area and disposed on a layer different from the first additional line portion;
a first additional bridge overlapping the first non-bending area, connecting the first additional line portion and the second additional line portion, and disposed on a layer different from the first additional line portion and the second additional line portion; and
wherein the first additional bridge does not overlap each of the first bridge and the second bridge when viewed in the second direction.

17. The display device of claim 16, wherein the first trace line further comprises:
a fifth line portion overlapping the second non-bending area and disposed on a same layer as the first line portion; and
a third bridge overlapping the second non-bending area, disposed on a same layer as the first bridge, and connected to the second line portion and the fifth line portion,
wherein the second trace line further comprises:
a sixth line portion overlapping the second non-bending area and disposed on a same layer as the third line portion; and
a fourth bridge overlapping the second non-bending area, disposed on a same layer as the second bridge, and connected to the fourth line portion and the sixth line portion, and
wherein the third trace line comprises:
a third additional line portion overlapping the second non-bending area and disposed on a same layer as the first additional line portion; and
a second additional bridge overlapping the second non-bending area, disposed on a same layer as the first additional bridge, and connected to the second additional line portion and the third additional line portion, and
wherein the third bridge, the fourth bridge, and the second additional bridge do not overlap each other when viewed in the second direction.

18. The display device of claim 1, wherein a width in the second direction of each of the first bridge and the second bridge is greater than a width in the second direction of each of the first line portion, the second line portion, the third line portion, and fourth line portion when viewed in a plane.

19. The display device of claim 1, further comprising:
a polarizing film disposed on the input sensor; and
a window panel disposed on the polarizing film.

20. A display device comprising:
a base layer comprising a first non-bending area, a bending area bent with respect to an imaginary axis, and a second non-bending area spaced apart from the first non-bending area in a first direction with the bending area interposed therebetween;
a plurality of light emitting elements disposed in the first non-bending area;
a thin film encapsulation layer disposed in the first non-bending area and encapsulating the light emitting elements;
sensing electrodes disposed in the first non-bending area and disposed on the thin film encapsulation layer;
a first trace line disposed in the first non-bending area, the second non-bending area and the bending area, and connected to a corresponding sensing electrode among the sensing electrodes; and
a second trace line disposed in the first non-bending area, the second non-bending area and the bending area, and connected to a corresponding sensing electrode among the sensing electrodes,
wherein the first trace line comprises:
a first line portion disposed in the first non-bending area;
a second line portion disposed in the bending area and disposed on a layer different from the first line portion; and
a first bridge disposed in the first non-bending area, connecting the first line portion to the second line portion, and disposed on a layer different from the first line portion and the second line portion,
wherein the second trace line comprises:
a third line portion disposed in the first non-bending area;
a fourth line portion disposed in the bending area and disposed on a layer different from the third line portion; and
a second bridge disposed in the first non-bending area, connecting the third line portion to the fourth line portion, and disposed on a layer different from the third line portion and the fourth line portion, wherein a distance between the first bridge and the bending area is different from a distance between the second bridge and the bending area when viewed in a plane, and wherein the first bridge is a highest layer of the first trace line, and the second bridge is a highest layer of the second trace line.

\* \* \* \* \*